(12) United States Patent
Nakata et al.

(10) Patent No.: US 11,437,505 B2
(45) Date of Patent: Sep. 6, 2022

(54) SEMICONDUCTOR DEVICE AND POWER CONVERSION DEVICE

(71) Applicant: Mitsubishi Electric Corporation, Tokyo (JP)

(72) Inventors: Kazunari Nakata, Tokyo (JP); Kensuke Taguchi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 76 days.

(21) Appl. No.: 16/968,233

(22) PCT Filed: Feb. 19, 2019

(86) PCT No.: PCT/JP2019/006005
§ 371 (c)(1),
(2) Date: Aug. 7, 2020

(87) PCT Pub. No.: WO2019/176466
PCT Pub. Date: Sep. 19, 2019

(65) Prior Publication Data
US 2021/0036141 A1 Feb. 4, 2021

(30) Foreign Application Priority Data
Mar. 15, 2018 (JP) .............................. JP2018-047539

(51) Int. Cl.
*H01L 21/28* (2006.01)
*H01L 29/66* (2006.01)
(Continued)

(52) U.S. Cl.
CPC ............ *H01L 29/78* (2013.01); *H01L 21/288* (2013.01); *H01L 33/06* (2013.01); *H01L 2933/0016* (2013.01)

(58) Field of Classification Search
CPC ....... H01L 21/28; H01L 21/288; H01L 29/66; H01L 29/66068; H01L 29/78; H01L 29/7802; H01L 29/7816; H01L 33/06
(Continued)

(56) References Cited

U.S. PATENT DOCUMENTS

2010/0240213 A1  9/2010  Urano et al.
2010/0323499 A1  12/2010 Takahashi et al.
(Continued)

FOREIGN PATENT DOCUMENTS

JP    2005019829 A    1/2005
JP    2005347313 A    12/2005
(Continued)

OTHER PUBLICATIONS

International Search Report (with English Translation) and Written Opinion issued in corresponding International Patent Application No. PCT/JP2019/006005, 14 pages (dated Apr. 23, 2019).
(Continued)

*Primary Examiner* — Fazli Erdem
(74) *Attorney, Agent, or Firm* — Buchanan Ingersoll & Rooney PC

(57) ABSTRACT

Even when a stress is applied due to energization or switching operation, a connection state of electrode layers can be appropriately maintained. A semiconductor device includes a semiconductor layer of first conductivity type, an upper surface structure formed on a surface layer of the semiconductor layer, and an upper surface electrode formed over the upper surface structure. The upper surface electrode includes a first electrode formed on an upper surface of the semiconductor layer, and a second electrode formed over an upper surface of the first electrode. The first concave portion is formed on the upper surface of the first electrode. A side surface of the first concave portion has a tapered shape. The
(Continued)

second electrode is formed over the upper surface of the first electrode including an inside of the first concave portion.

18 Claims, 33 Drawing Sheets

(51) Int. Cl.
*H01L 29/78* (2006.01)
*H01L 33/06* (2010.01)
*H01L 21/288* (2006.01)

(58) Field of Classification Search
USPC .......................................................... 257/98
See application file for complete search history.

(56) References Cited

U.S. PATENT DOCUMENTS

| 2014/0205856 A1 | 7/2014 | Jiang et al. |
| 2015/0295071 A1 | 10/2015 | Hikasa |
| 2017/0186847 A1 | 6/2017 | Hikasa et al. |
| 2018/0286974 A1* | 10/2018 | Kumazawa ....... H01L 29/41741 |
| 2019/0057873 A1 | 2/2019 | Sugahara et al. |

FOREIGN PATENT DOCUMENTS

| JP | 2011003726 A | 1/2011 |
| JP | 2015213163 A | 11/2015 |
| JP | 2017079239 A | 4/2017 |
| JP | 2017118060 A | 6/2017 |
| WO | 2017169086 A1 | 10/2017 |

OTHER PUBLICATIONS

Office Action dated May 25, 2021, issued in corresponding Japanese Patent Application No. 2020-505717, 16 pages including 8 pages of English translation.

Office Action dated Mar. 21, 2022, issued in the German Patent Application No. 112019001359.9, 14 pages including 6 pages of English Translation.

* cited by examiner

F I G. 1
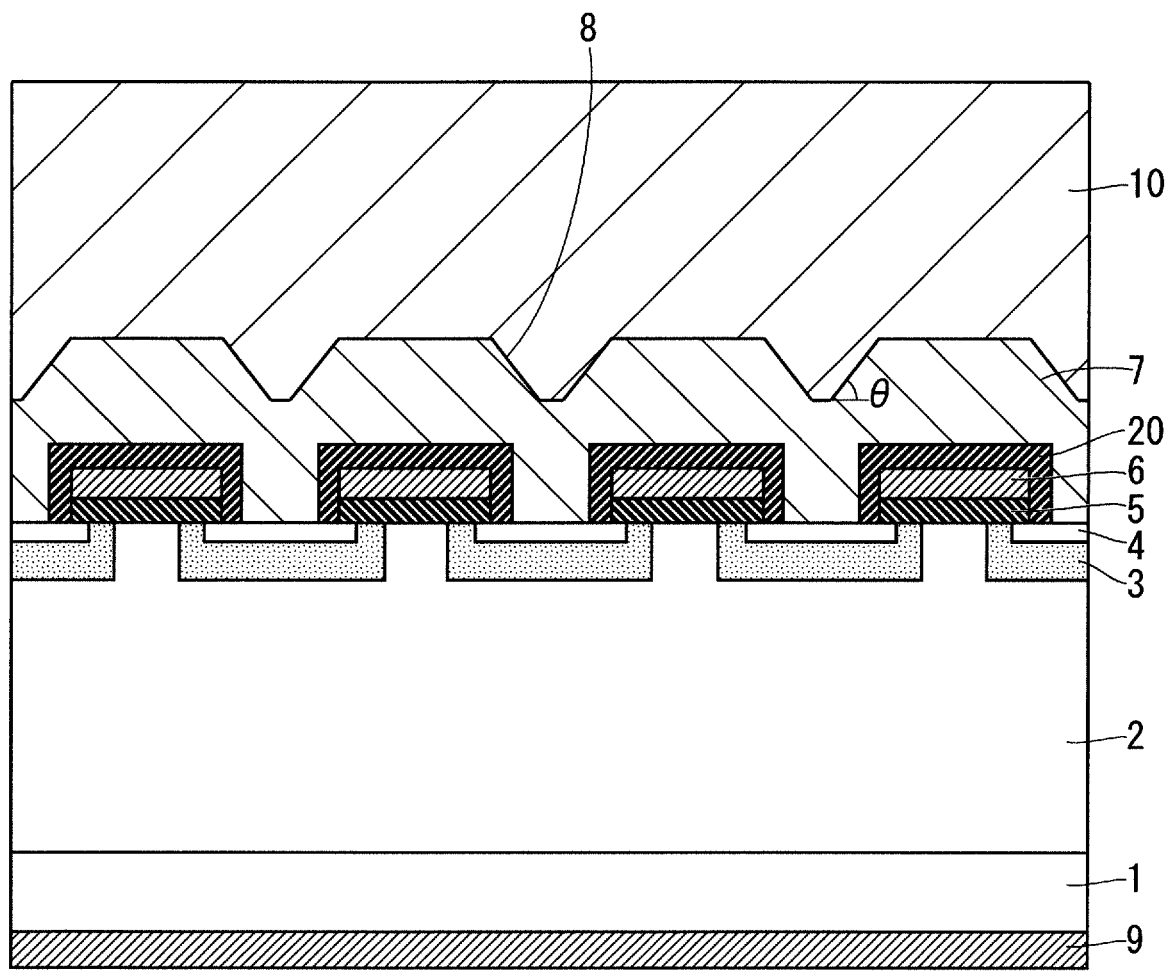

F I G. 2
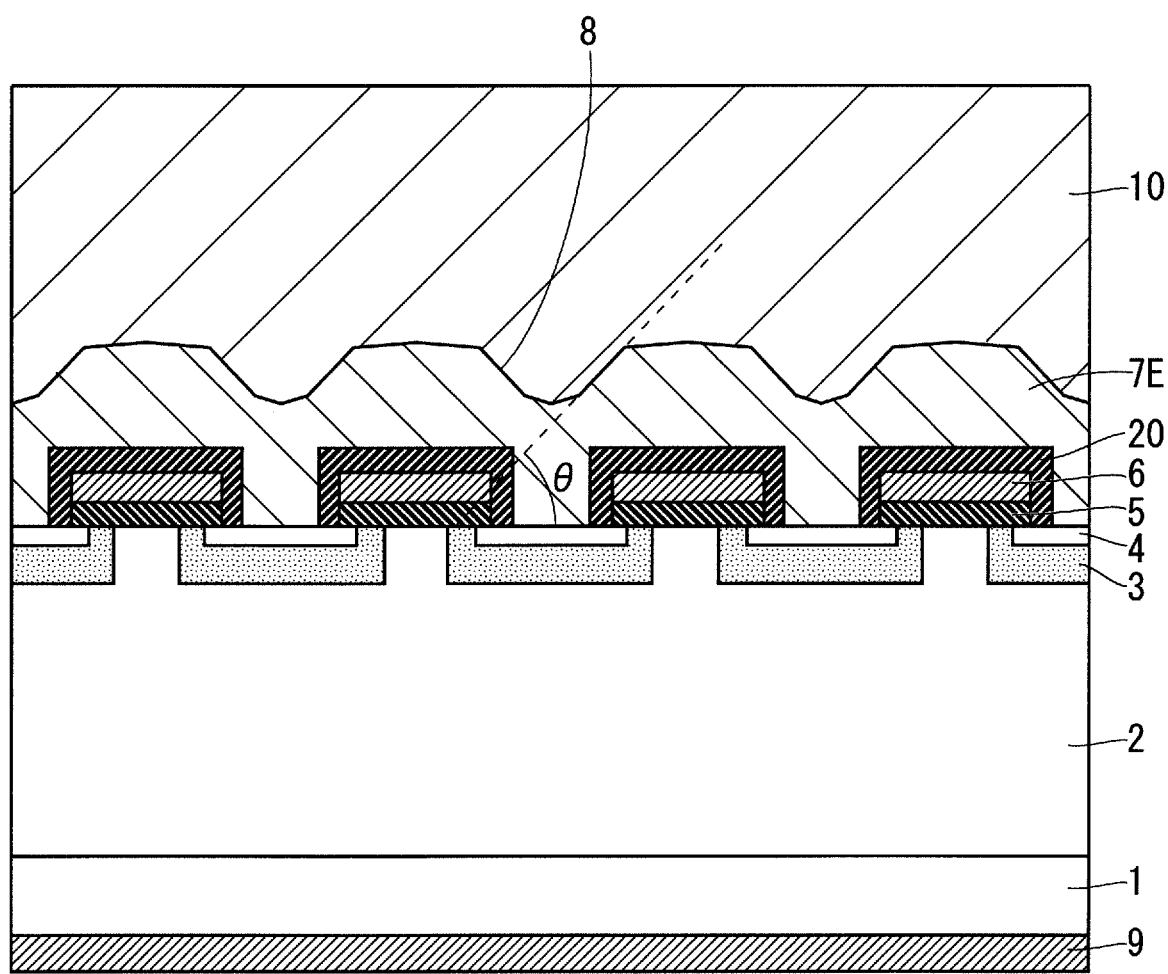

F I G. 3
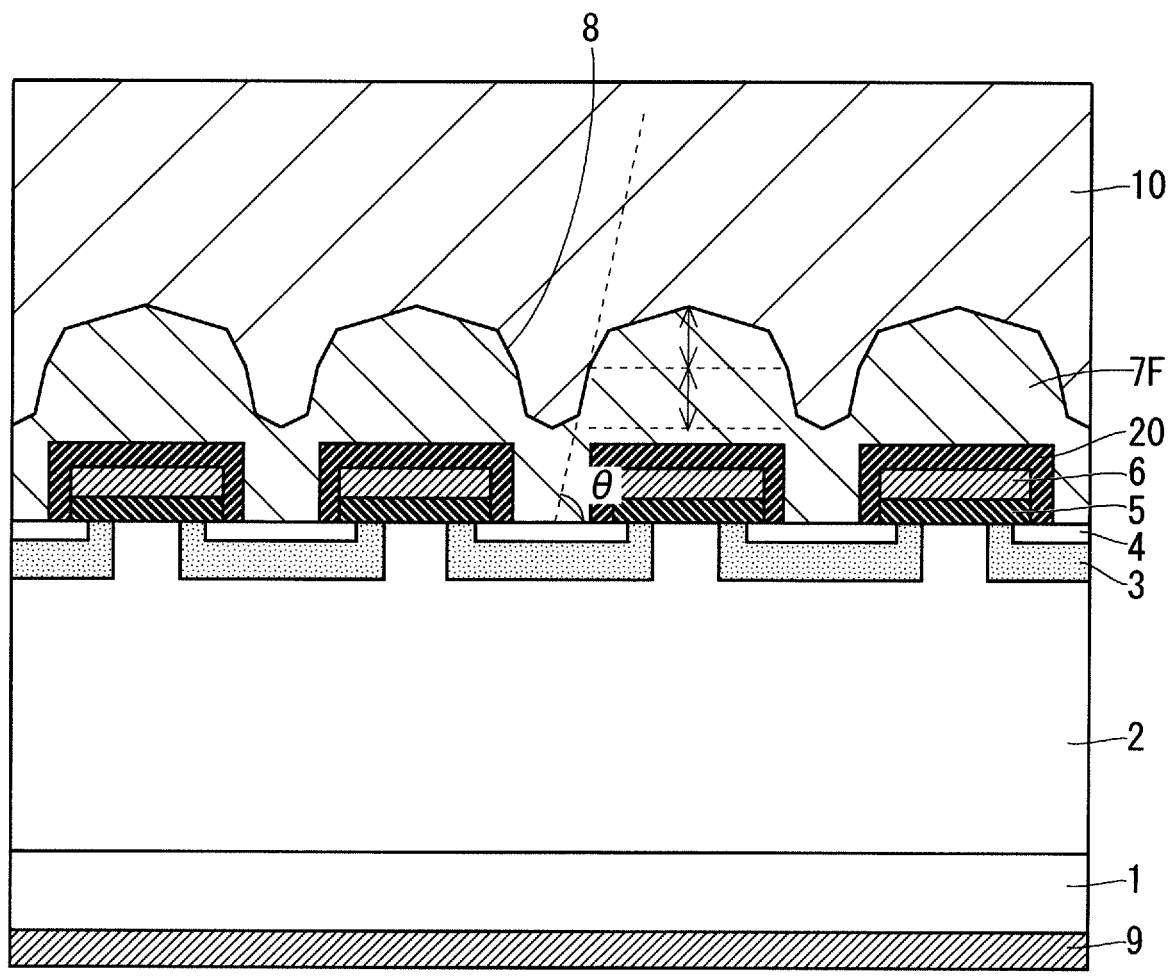

F I G. 4
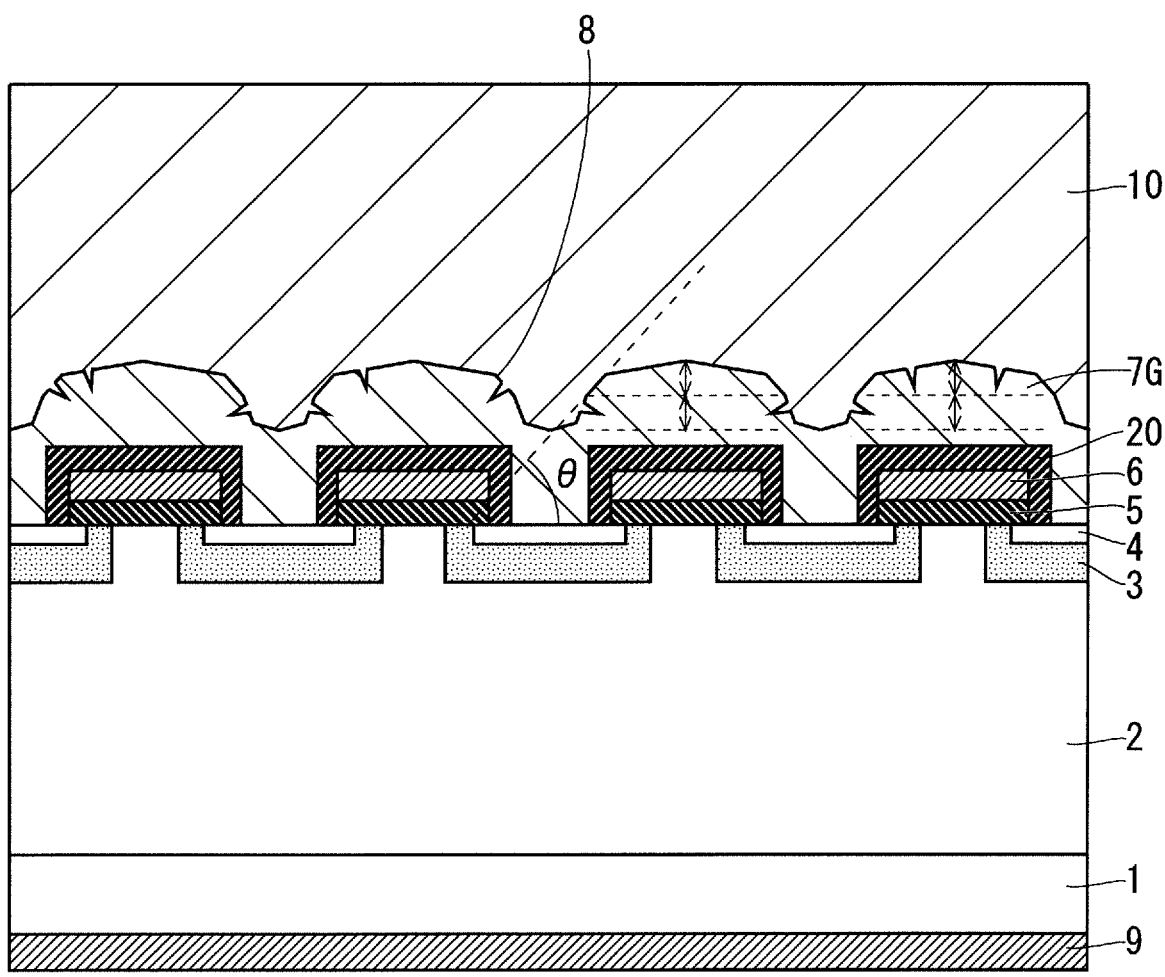

F I G. 5
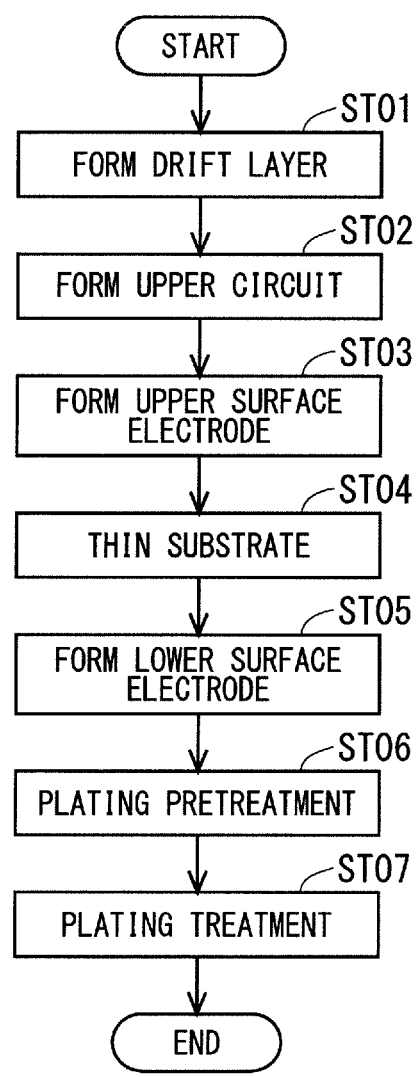

F I G. 8
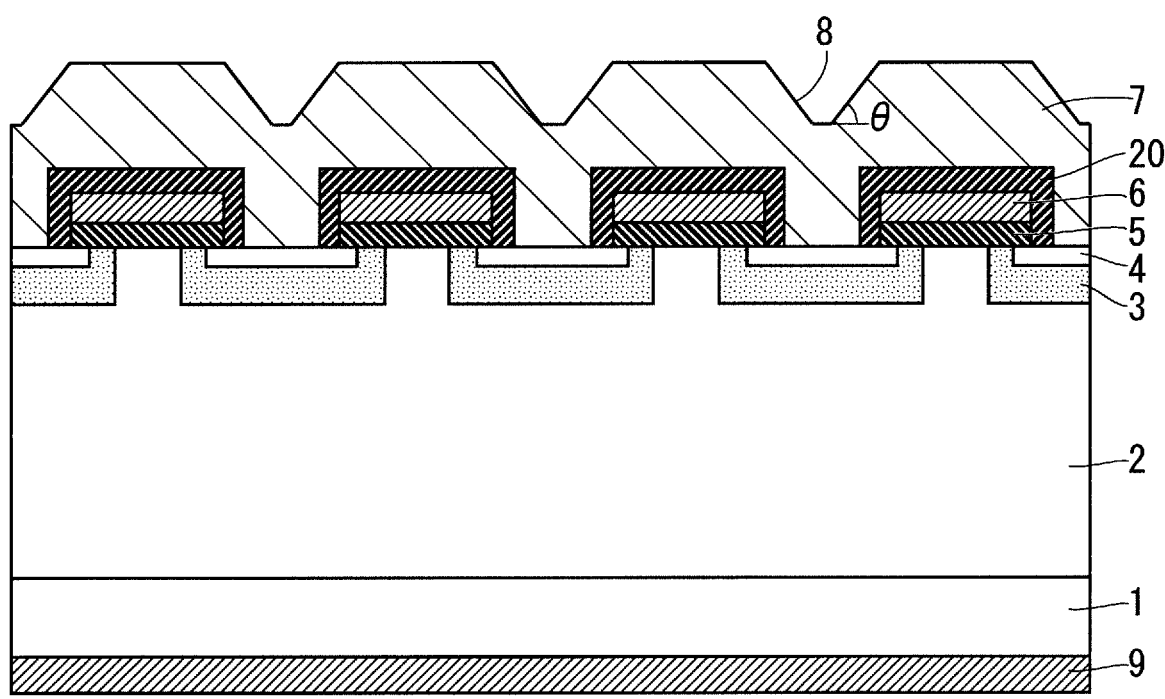

F I G. 1 1
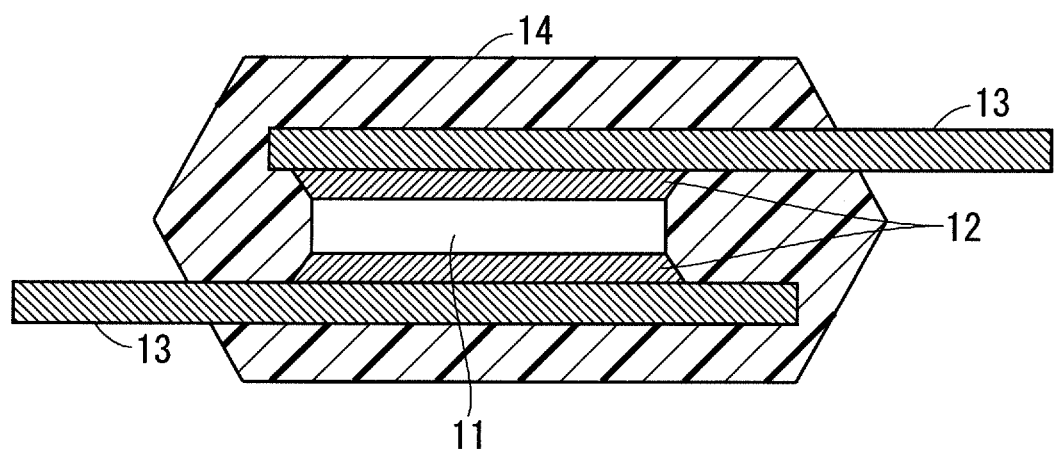

F I G. 1 3
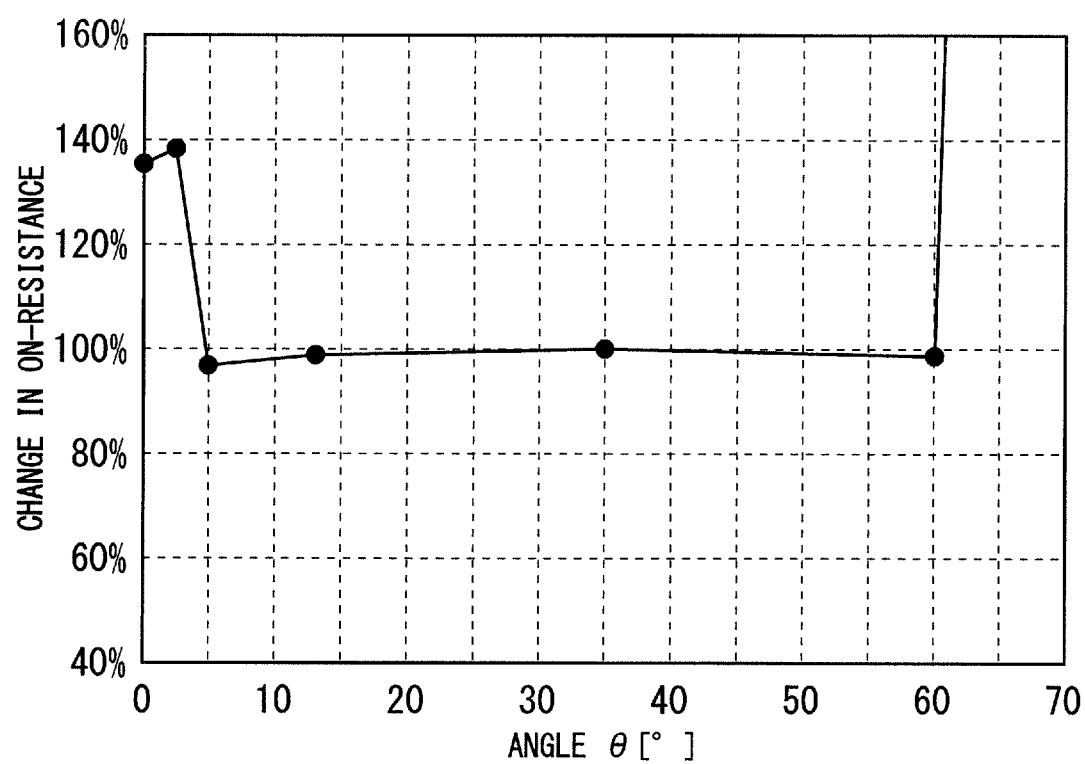

F I G. 1 5
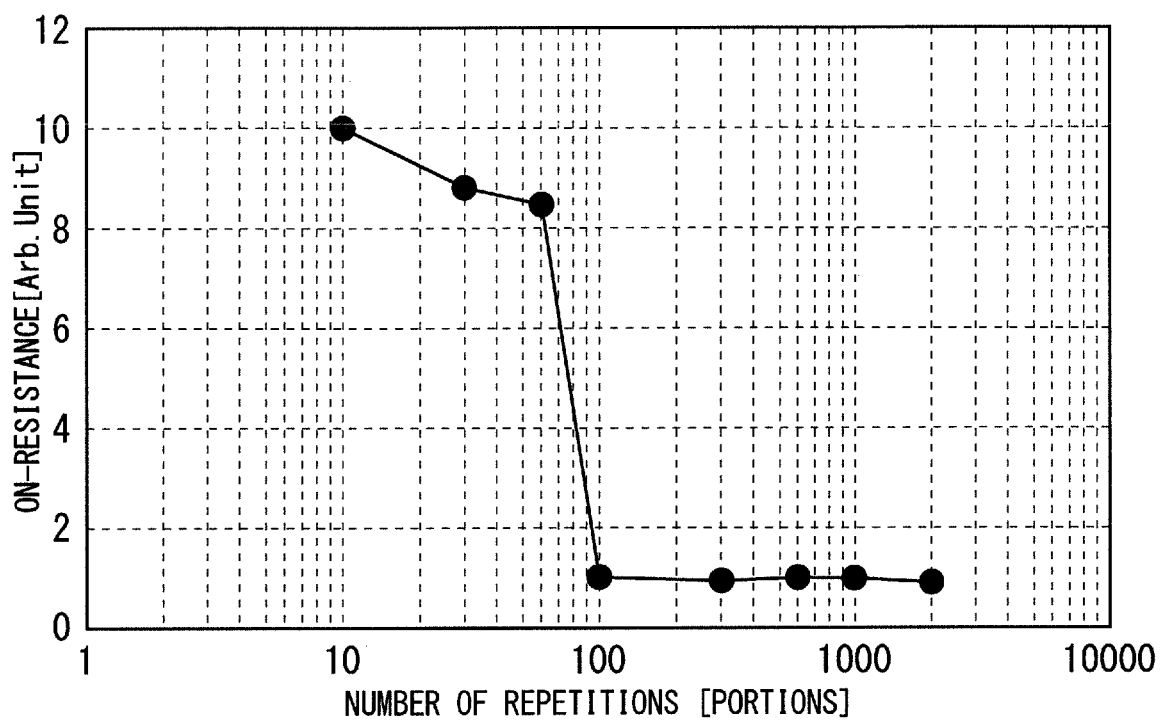

F I G. 1 7
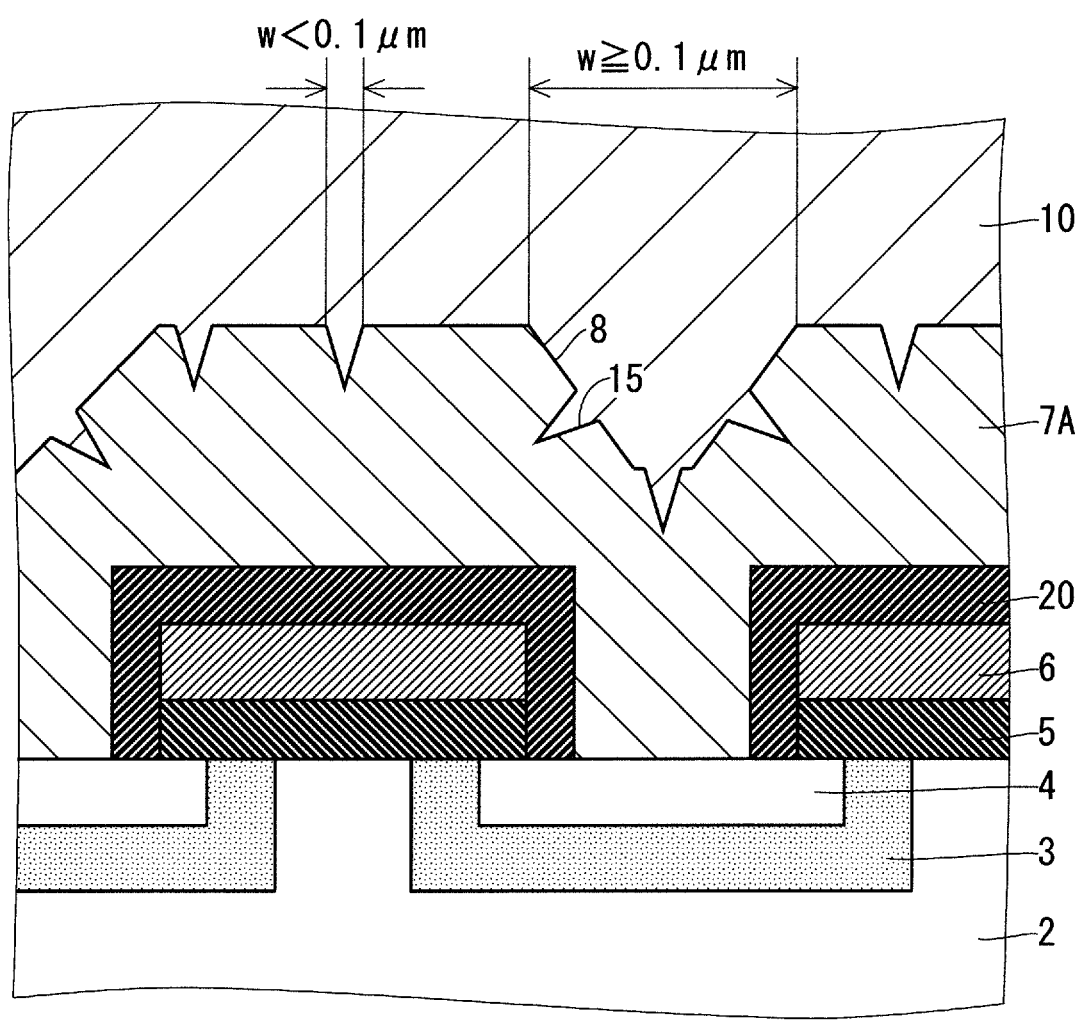

F I G. 2 1
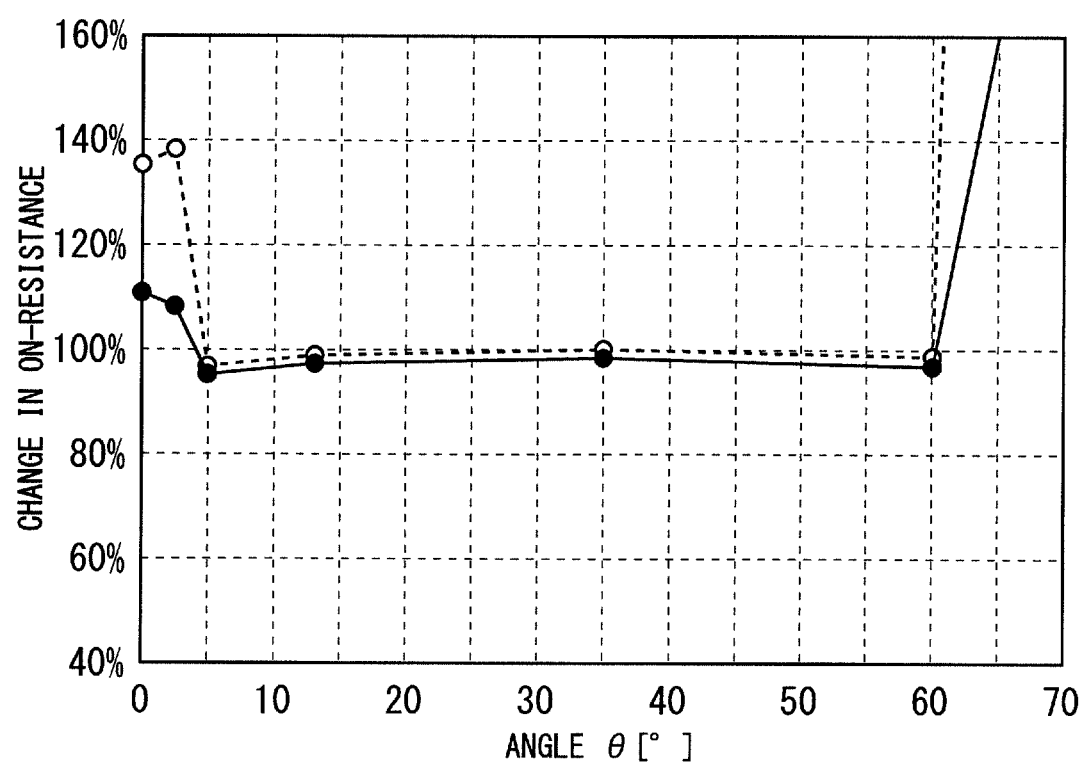

F I G. 2 4
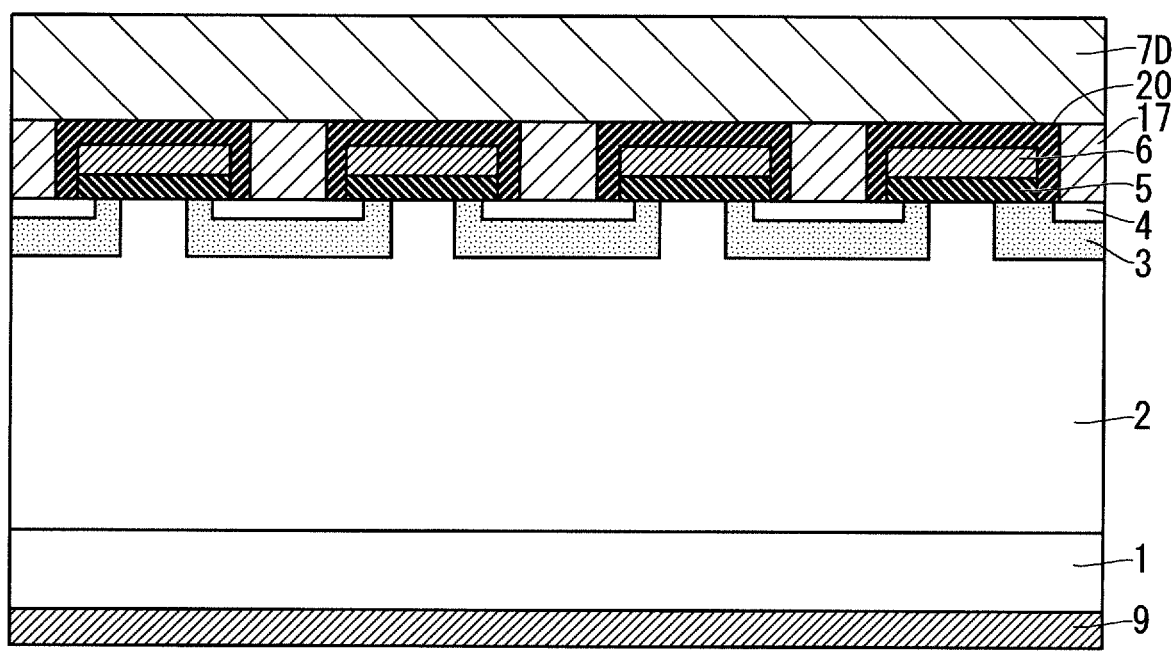

F I G. 25

| | MINUTE CONCAVE PORTION:ZERO | MINUTE CONCAVE PORTION :ONE OR MORE/1 $\mu m^2$ | MINUTE CONCAVE PORTION :TEN OR MORE/1 $\mu m^2$ | MINUTE CONCAVE PORTION :30 OR MORE/1 $\mu m^2$ |
|---|---|---|---|---|
| RATE OF CHANGE IN ON-RESISTANCE (%) | 117.8 | 100.0 | 99.8 | 100.2 |

F I G. 2 6
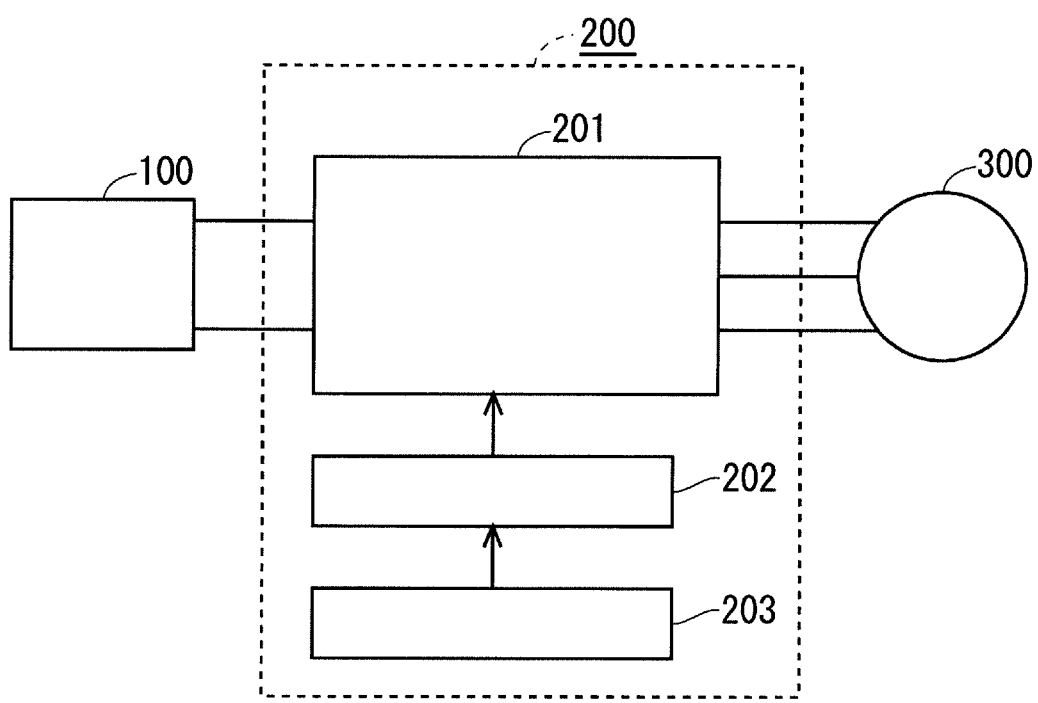

F I G. 2 7
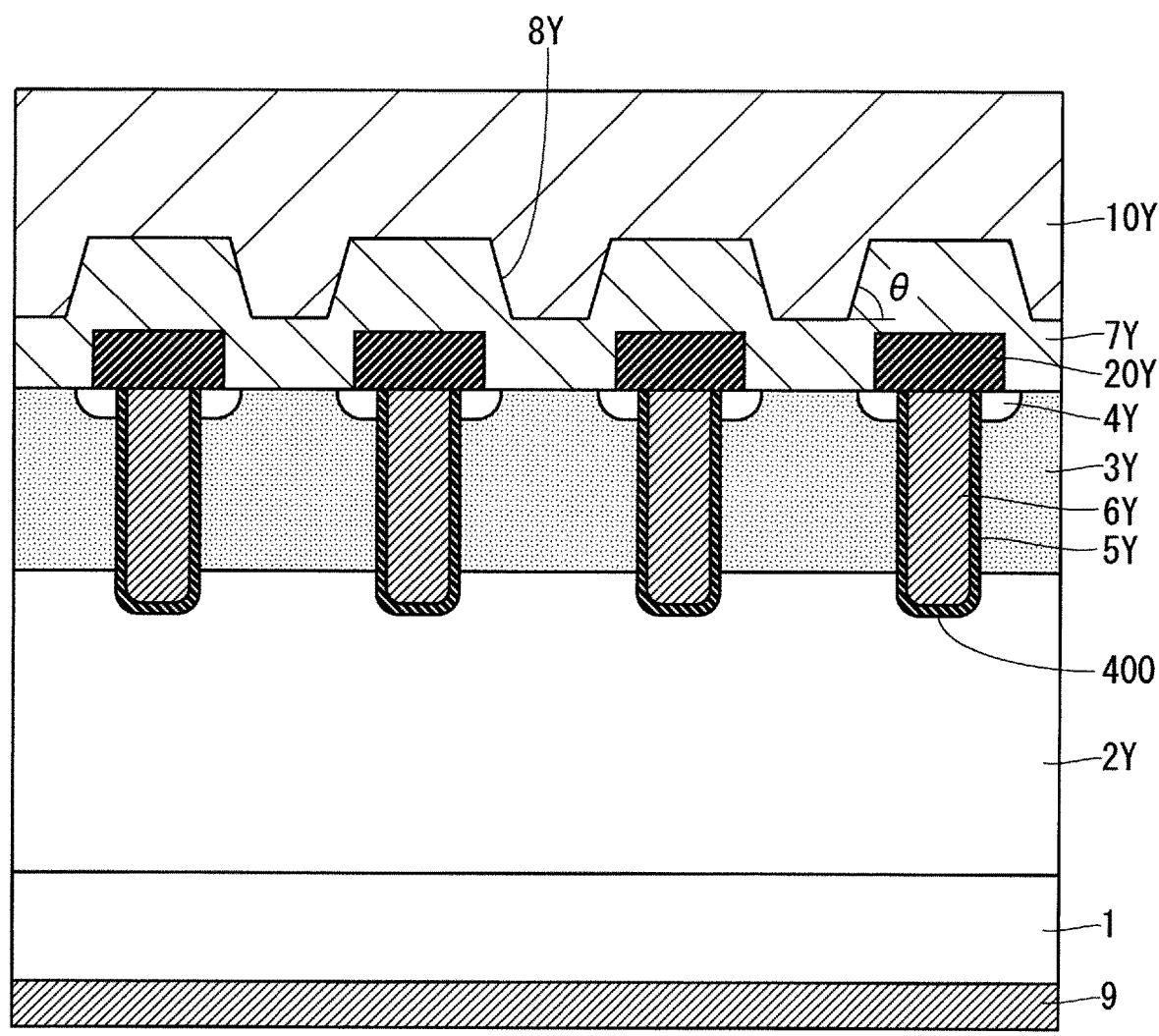

F I G. 3 0
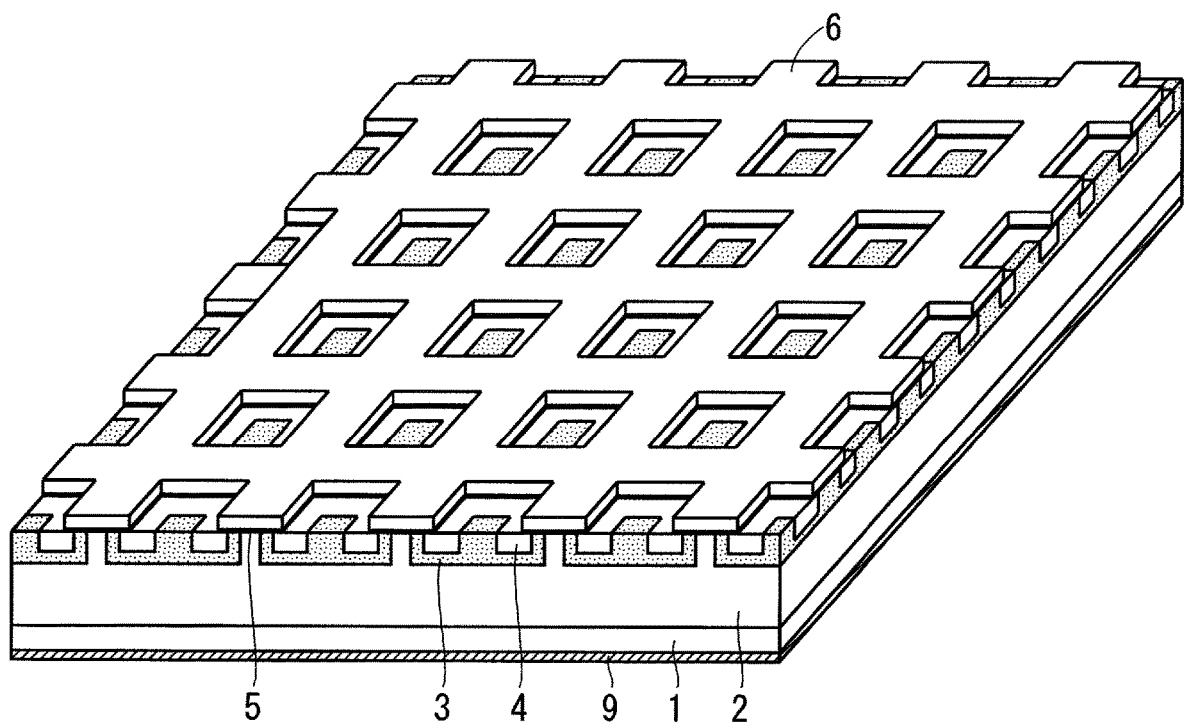

F I G. 3 1
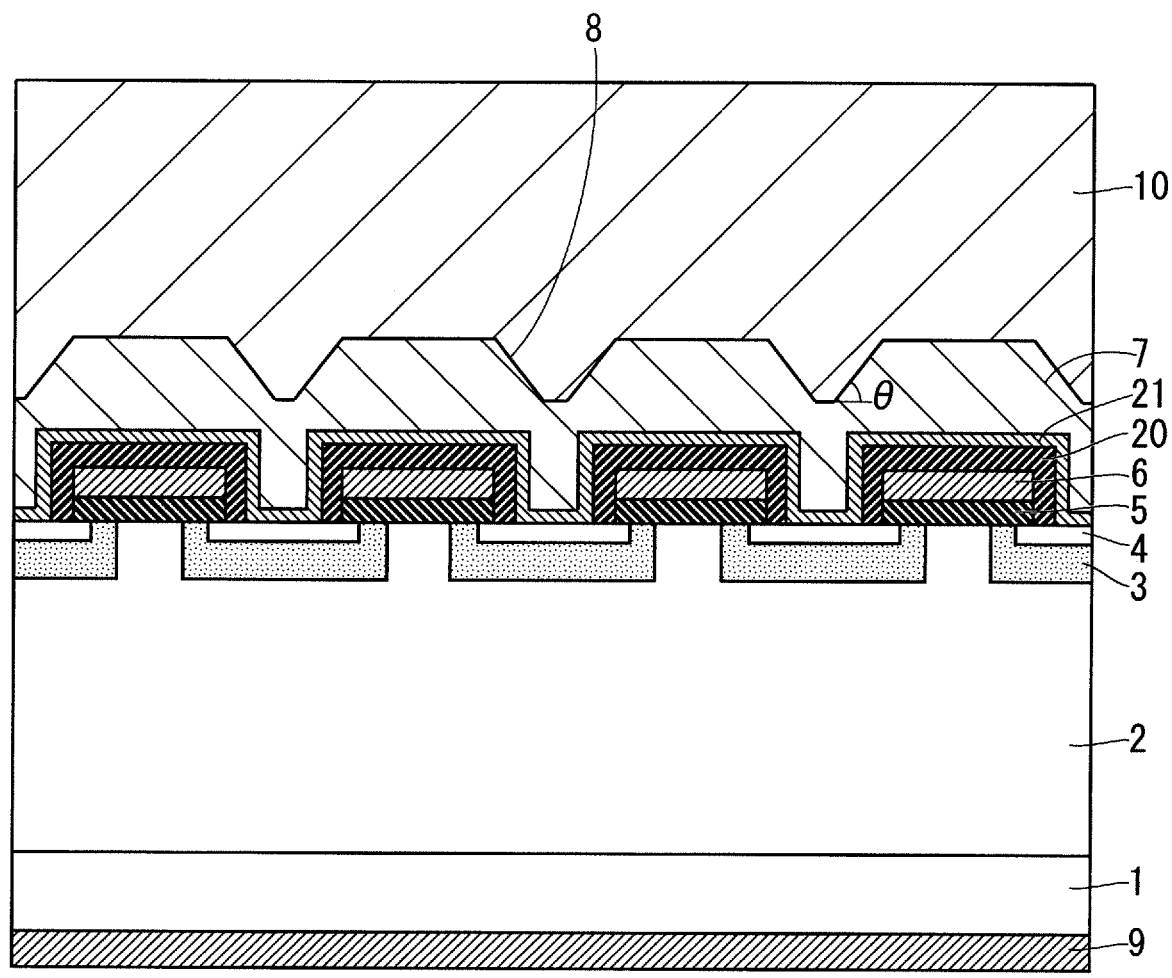

SEMICONDUCTOR DEVICE AND POWER CONVERSION DEVICE

TECHNICAL FIELD

The technique disclosed in the present specification relates to a semiconductor device, for example, to a power semiconductor device.

BACKGROUND ART

To enable semiconductor devices to withstand higher breakdown voltages, reduce losses, and be used under high-temperature environments, a semiconductor device using a silicon carbide (SiC) semiconductor substrate that has higher breakdown voltage and heat resistance than a semiconductor device using a silicon (Si) semiconductor substrate is applied to power semiconductor devices such as metal-oxide-semiconductor field-effect transistor (i.e., MOSFET) or Schottky barrier diode (i.e., SBD).

For example, in the case of a SiC-MOSFET with a breakdown voltage of 1 kV or more and about 1.2 kV or less, an on-resistance of 5 m$\Omega$ cm$^2$ or less is obtained, and the resistance value thereof is equal to or lower than a half of that of a Si-MOSFET or Si-insulated gate bipolar transistor (i.e., IGBT) with the same breakdown voltage.

The use of a SiC semiconductor substrate significantly reduces on-resistance more than in the case where Si is used. The reason for this is because SiC has high dielectric breakdown electric field; therefore, the breakdown voltage layer (that is, a drift layer) for realizing the same breakdown voltage can be made thinner than when Si is used, further, the impurity doping amount of the breakdown voltage layer can be increased, or the like.

It is expected that the replacement of most IGBTs using Si as inverter components will proceed in the future by improving manufacturing costs, improving process technology, and improving other performances.

Meanwhile, when such a front and back conductive type power semiconductor device is mounted on a circuit board or the like, the back surface of the power semiconductor device is soldered on the circuit board, and the front surface of the power semiconductor device is wire-bonded with an aluminum wire or the like to establish electrical connection.

With the improvement in the conducting performance of a power semiconductor device in recent years, a structure has been adopted in which the conducting performance or heat dissipation performance of the power semiconductor module incorporating the power semiconductor device by soldering both the front and back surfaces of the power semiconductor device (see, Patent Document 1).

When soldering both sides of the power semiconductor device, a nickel (Ni) film of about several μm is required for soldering on an electrode layer formed on the surface of the power semiconductor device. In the case of forming a nickel film, the vacuum film formation method such as vapor deposition or sputtering has a low film formation rate, and a problem remains in terms of productivity or manufacturing cost. For this reason, plating, which is a wet film formation method capable of high-rate film formation, has attracted attention.

PRIOR ART DOCUMENTS

Patent Documents

[Patent Document 1] Japanese Patent Application Laid-Open No. 2005-019829

SUMMARY

Problem to be Solved by the Invention

For a semiconductor device using a SiC semiconductor substrate, which is superior in breakdown voltage and heat resistance to the case of using Si, a smaller and more efficient device has been developed by utilizing a high dielectric breakdown electric field of SiC.

Therefore, the structure has been adopted in which the conducting performance or heat dissipation performance of the power semiconductor module incorporating the power semiconductor device by soldering both the front and back surfaces of the power semiconductor device, as described above, a nickel film of about several μm as an additional electrode layer for soldering is required to be formed on the electrode layer formed on the surface of the power semiconductor device.

Upon switching operation, temperature changes during switching operation become larger than when Si is used, as SiC ensures operations at high temperatures, which increases the stress received by the semiconductor device from the surrounding sealing resin or the lead frame. Therefore, the nickel film may be exfoliated from the electrode layer on the surface of the power semiconductor device due to the stress.

The technique disclosed in the present specification has been made to solve the problems described above, and an object thereof is to provide a technique in which, the connection state of the electrode layer is maintained even when stress is applied due to energization or switching operation.

Means to Solve the Problem

A first aspect of the technology disclosed in the present specification includes a semiconductor layer of first conductivity type, an upper surface structure formed at least on a surface layer of the semiconductor layer, and an upper surface electrode formed over at least the upper surface structure. The upper surface electrode includes a first electrode formed on at least an upper surface of the semiconductor layer, and a second electrode formed over an upper surface of the first electrode. At least one first concave portion is formed on the upper surface of the first electrode. A side surface of the first concave portion has a tapered shape. The second electrode is formed over the upper surface of the first electrode including the first concave portion.

A second aspect of the technology disclosed in the present specification includes a semiconductor layer of first conductivity type, an upper surface structure formed at least on a surface layer of the semiconductor layer, and an upper surface electrode formed over at least the upper surface structure. The upper surface electrode includes a first electrode formed on at least an upper surface of the semiconductor layer, and a second electrode formed over an upper surface of the first electrode. At least one first concave portion and at least one second concave portion having a width smaller than that of the first concave portion are formed on the upper surface of the first electrode. The second electrode is formed over the upper surface of the first electrode including the first concave portion and the second concave portion.

A third aspect of the technology disclosed in the present specification includes a conversion circuit including the above-described semiconductor device, and configured to convert input power and output the power, a drive circuit configured to output a drive signal for driving the semiconductor device to the semiconductor device, and a control circuit configured to output a control signal for controlling the drive circuit to the drive circuit.

Effects of the Invention

A first aspect of the technology disclosed in the present specification includes a semiconductor layer of first conductivity type, an upper surface structure formed at least on a surface layer of the semiconductor layer, and an upper surface electrode formed over at least the upper surface structure. The upper surface electrode includes a first electrode formed on at least an upper surface of the semiconductor layer, and a second electrode formed over an upper surface of the first electrode. At least one first concave portion is formed on the upper surface of the first electrode. A side surface of the first concave portion has a tapered shape. The second electrode is formed over the upper surface of the first electrode including the first concave portion. According to such a configuration, with a configuration in which the second electrode is formed also in the concave portion formed on the upper surface of the first electrode, even when the stress is applied by energization, switching operation or the like, the contact area between the first electrode and the second electrode can be increased and in addition, the stress applied to the contact portion can be reduced. Therefore, the connection between the first electrode and the second electrode can be maintained in an appropriate state; therefore, the reliability of the semiconductor device can be improved while suppressing the exfoliation of the electrode of the semiconductor device.

A second aspect of the technology disclosed in the present specification includes a semiconductor layer of first conductivity type, an upper surface structure formed at least on a surface layer of the semiconductor layer, and an upper surface electrode formed over at least the upper surface structure. The upper surface electrode includes a first electrode formed on at least an upper surface of the semiconductor layer, and a second electrode formed over an upper surface of the first electrode. At least one first concave portion and at least one second concave portion having a width smaller than that of the first concave portion are formed on the upper surface of the first electrode. The second electrode is formed over the upper surface of the first electrode including the first concave portion and the second concave portion. According to such a configuration, the contact area between the first electrode and the second electrode can be increased, and the stress applied to the contact portion can be reduced. Therefore, the connection between the first electrode and the second electrode can be maintained in an appropriate state.

A third aspect of the technology disclosed in the present specification includes a conversion circuit including the above-described semiconductor device, and configured to convert input power and output the power, a drive circuit configured to output a drive signal for driving the semiconductor device to the semiconductor device, and a control circuit configured to output a control signal for controlling the drive circuit to the drive circuit. According to such a configuration, the contact area between the first electrode and the second electrode can be increased, and the stress applied to the contact portion can be reduced. Therefore, the connection between the first electrode and the second electrode can be maintained in an appropriate state.

The explicit purpose, feature, phase, and advantage of the technology disclosed in the present specification will be described in detail hereunder with attached drawings.

BRIEF DESCRIPTION OF DRAWINGS

FIG. 1 A cross-sectional view schematically illustrating an example of a configuration of a semiconductor device according to Embodiment.

FIG. 2 A cross-sectional view related to the definition of an angle θ in the configuration of the semiconductor device.

FIG. 3 A cross-sectional view related to the definition of an angle θ in the configuration of the semiconductor device.

FIG. 4 A cross-sectional view related to the definition of an angle θ in the configuration of the semiconductor device.

FIG. 5 A flowchart illustrating an example of a manufacturing process of the semiconductor device according to Embodiment.

FIG. 8 A cross-sectional view illustrating the example of the manufacturing process of the semiconductor device according to Embodiment.

FIG. 11 A cross-sectional view illustrating an example of a configuration of a semiconductor module including the semiconductor device.

FIG. 13 A graph illustrating a change in the on-resistance of the semiconductor device after energization and cutoff are repeated.

FIG. 15 A graph illustrating an example of a relationship between the number of repetitions of concave portions and a change in on-resistance after undergoing the energization cycle.

FIG. 17 An enlarged cross-sectional view illustrating a part of a structure including a source electrode of the semiconductor device whose example is illustrated in FIG. 16.

FIG. 21 A graph illustrating a change in the on-resistance of the semiconductor device after energization and cutoff are repeated.

FIG. 24 A cross-sectional view illustrating an example of a configuration further including a bonding electrode.

FIG. 25 A table illustrates a change in the on-resistance of the semiconductor device after energization and cutoff are repeated.

FIG. 26 A diagram conceptually illustrating an example of a configuration of a power conversion system including a power conversion device according to Embodiment.

FIG. 27 A cross-sectional view schematically illustrating an example of a configuration of a semiconductor device according to Embodiment.

FIG. 30 A bird's eye view schematically illustrating the example of the configuration of the semiconductor device according to Embodiment.

FIG. 31 A cross-sectional view schematically illustrating an example of the configuration of the semiconductor device illustrated in FIG. 1 further including a barrier metal.

DESCRIPTION OF EMBODIMENTS

Figure 6:
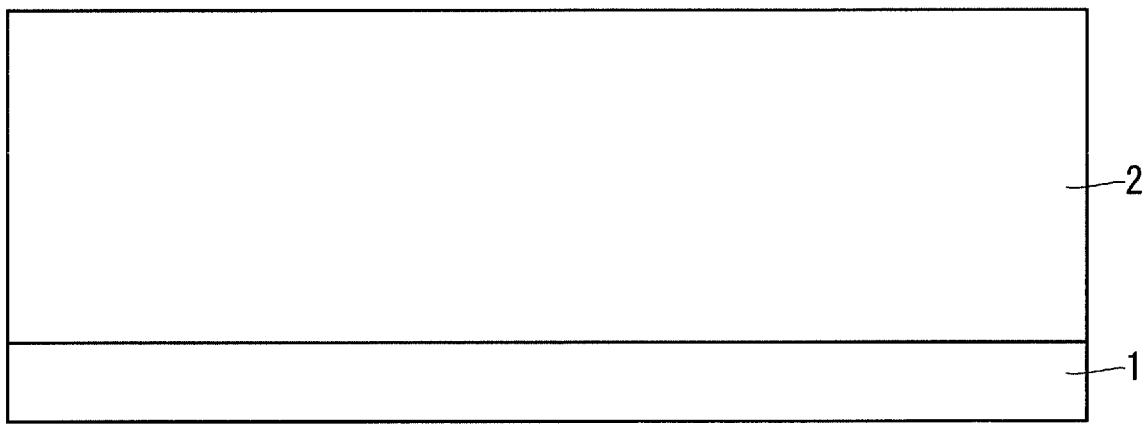
FIG. 6 A cross-sectional view illustrating the example of the manufacturing process of the semiconductor device according to Embodiment.

Hereinafter, Embodiments will be described with reference to the accompanying drawings.

The drawings are schematically illustrated, and for convenience of description, the configuration is omitted or simplified as appropriate. Further, the relationship between the size and the position of the configuration and the like illustrated in the different drawings is not necessarily accurately depicted, and can be appropriately changed.

In the following description, the same components are denoted by the same reference numerals, and their names and functions are the same. Therefore, a detailed description thereof may be omitted to avoid redundancy.

Also, in the following description, even when terms indicating a specific position and direction such as "upper", "lower", "left", "right", "side", "bottom", "front" or "rear" are stated, the terms are used to facilitate understanding of Embodiments for convenience, and therefore, they are irrelevant to directions in practical implementation.

Further, in the following description, even when ordinal numbers such as "first" or "second" are stated, the terms are used to facilitate understanding of Embodiments, and therefore, the usage of the ordinal umbers does not limit the indication of the ordinal numbers to ordering.

Embodiment 1

Hereinafter, a semiconductor device and a method of manufacturing the semiconductor device according to Embodiment 1 are described. In the following description, it is assumed that the first conductivity type is an n-type and the second conductivity type is a p-type.

<Configuration of Semiconductor Device>

FIG. 1 is a cross-sectional view schematically illustrating an example of a configuration of a semiconductor device according to Embodiment 1. FIG. 1 illustrates a case where SiC is used for a semiconductor substrate. The configuration illustrated in FIG. 1 is a SiC-MOSFET having a planar gate structure, and a cell structure of a main part thereof. As the overall configuration of the semiconductor device, the configuration illustrated in FIG. 1 is extended in the left-right direction of FIG. 1.

As illustrated in FIG. 1, the semiconductor device includes an n-type SiC substrate 1, an n-type drift layer 2 formed on the upper surface of the SiC substrate 1, a p-type base region 3 selectively formed on the surface layer of the drift layer 2, an n-type source region 4 selectively formed on the surface layer of the base region 3, a gate electrode 6 formed on the upper surface of the base region 3 interposed between the source region 4 and the drift layer 2 via a gate insulating film 5, an interlayer insulating film 20 formed over the gate electrode 6, a source electrode 7 formed over the upper surface of the interlayer insulating film 20 and the upper surface of the exposed source region 4, a source electrode 10 formed on the upper surface of the source electrode 7, and a drain electrode 9 formed on the lower surface of SiC substrate 1.

Here, a tapered concave portion 8 is formed on the upper surface of the source electrode 7, and each side surface of the tapered concave portion 8 has a tapered shape. Note that the angle between the side surface of the tapered concave portion 8 and the upper surface of the SiC substrate 1 is defined as an angle θ. Further, the source electrode 10 is formed over the inside of the tapered concave portion 8, that is, the upper surface including the inside of the tapered concave portion 8.

The taper angle θ is smaller than the angle formed between the interlayer insulating film 20 and the drift layer 2. FIG. 30 illustrates a bird's-eye view from above the sheet surface when the source electrode 7 and the source electrode 10 are removed.

In FIG. 30, of the components illustrated in FIG. 1, the drain electrode 9, the SiC substrate 1, the drift layer 2, the base region 3, the source region 4, and the gate electrode 6 formed via the gate insulating film 5 are illustrated.

FIG. 2 is a cross-sectional view related to the definition of the angle θ in the configuration of the semiconductor device. As illustrated in an example in FIG. 2, a tapered portion of the source electrode 7E includes a tapered concave portion and a tapered convex portion.

In the process of manufacturing a semiconductor device, for example, when heat treatment is performed at the time of forming an insulating film, alternatively, when cleaning is performed using a chemical solution such as an acid solution or an alkaline solution to clean the upper surface of the source electrode 7E, the corners of the tapered concave portion and the tapered convex portion on the upper surface of the source electrode 7E are removed.

In this case, the structure does not develop into the structure whose example is illustrated in FIG. 1 but the structure whose example is illustrated in FIG. 2. In such a case, the angle θ is difficult to define as illustrated in the example in FIG. 1.

Therefore, the midpoint between the portion located at the uppermost of the tapered convex portion of the source electrode 7E and the portion located at the bottom of the tapered concave portion of the source electrode 7E is determined, and further, a tangent line to the slope of the tapered concave portion located at the same height as the midpoint is drawn. The angle between the tangent line and the upper surface of SiC substrate 1 is defined as angle θ.

FIG. 3 is a cross-sectional view related to the definition of the angle θ in the configuration of the semiconductor device. As illustrated in an example in FIG. 3, the tapered portion of the source electrode 7E includes a tapered concave portion and a tapered convex portion.

Even if the tapered concave portion is large as illustrated in the example in FIG. 3, the midpoint between the portion located at the uppermost of the tapered convex portion of the source electrode 7F and the portion located at the bottom of the tapered concave portion of the source electrode 7F is determined, and further, a tangent line to the slope of the tapered concave portion located at the same height as the midpoint is drawn. The angle between the tangent line and the upper surface of SiC substrate 1 is defined as angle θ.

FIG. 4 is a cross-sectional view related to the definition of the angle θ in the configuration of the semiconductor device. As illustrated in an example in FIG. 4, a tapered portion of the source electrode 7G also includes a tapered concave portion and a tapered convex portion.

Even in the case where minute concave portions described later are formed, as illustrated in the example in FIG. 4, the midpoint between the portion located at the uppermost of the tapered convex portion of the source electrode 7G and the portion located at the bottom of the tapered concave portion of the source electrode 7G is determined, and further, a tangent line to the slope of the tapered concave portion located at the same height as the midpoint is drawn. Here, the slope of the tapered concave portion is a slope excluding a minute concave portion. The angle between the tangent line and the upper surface of SiC substrate 1 is defined as angle θ.

FIG. 31 is a cross-sectional view schematically illustrating an example of a configuration of the semiconductor device illustrated in FIG. 1 further including a barrier metal described later.

As illustrated in the example in FIG. 31, the semiconductor device includes an n-type SiC substrate 1, a drift layer 2, a base region 3, a source region 4, a gate electrode 6 formed via a gate insulating film 5, an interlayer insulating film 20, a barrier metal 21 formed over the upper surface of the interlayer insulating film 20 and the upper surface of the exposed source region 4, a source electrode 7 formed over the upper surface and the side surfaces of the barrier metal 21, a source electrode 10, and a drain electrode 9.

<Manufacturing Method of Semiconductor Device>

Figure 7:
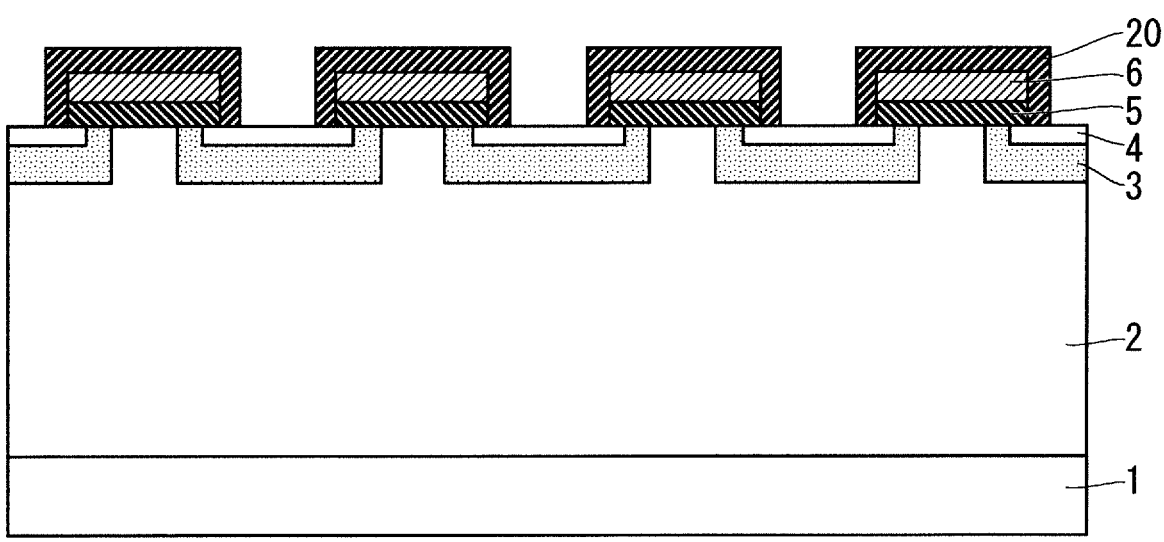
FIG. 7 A cross-sectional view illustrating the example of the manufacturing process of the semiconductor device according to Embodiment.

Next, a method of manufacturing the semiconductor device according to Embodiment 1 will be described with reference to FIGS. 5 to 8. FIG. 5 is a flowchart illustrating an example of a manufacturing process of the semiconductor device according to Embodiment 1. FIGS. 6, 7, and 8 are cross-sectional views illustrating the example of the manufacturing process of the semiconductor device according to Embodiment 1.

First, as illustrated in the example in FIG. 6, the drift layer 2 made of n-type SiC is epitaxially grown on the upper surface of the n-type SiC substrate 1 (Step ST01). Next, as illustrated in the example in FIG. 7, after forming a mask (not illustrated here) made of a resist or the like, ion implantation of impurities is performed. Then, the p-type base region 3 is selectively formed on the surface layer of the drift layer 2, Examples of the p-type impurities include boron (B) or aluminum (Al).

Next, as illustrated in the example in FIG. 7, after forming a mask (not illustrated here) made of a resist or the like, ion implantation of impurities is performed for each of the p-type base regions 3. Then, the n-type source region 4 is selectively formed on the surface layer of the base region 3. Examples of the n-type impurities include phosphorus (P) or nitrogen (N).

Thereafter, as illustrated in the example in FIG. 7, the SiC substrate 1 is subject to heat treatment at a high temperature by a heat treatment device (not illustrated here) in order to activate the base region 3 and the source region 4. Then, p-type ions implanted into base region 3 and n-type ions implanted into source region 4 are electrically activated.

Thereafter, as illustrated in the example in FIG. 7, the gate insulating film 5 is formed on the upper surface of the source region 4, the upper surface of the base region 3, and the upper surface of the drift layer 2 by a deposition method such as a thermal oxidation method or a chemical vapor deposition. Next, the gate electrode 6 is formed on the upper surface of the gate insulating film 5, and further, the gate electrode 6 is patterned. The patterned gate electrode 6 is formed on the upper surface of the base region 3 interposed between the source region 4 and the drift layer 2.

Thereafter, as illustrated in the example in FIG. 7, the remaining portion of the gate insulating film 5 on the upper surface of the source region is removed by a photolithography technique and an etching technique. Then, the interlayer insulating film 20 is formed, and further, the interlayer insulating film 20 is patterned (Step ST02).

Next, as illustrated in the example in FIG. 7, aluminum, an aluminum alloy made of aluminum and silicon, or nickel is deposited to form a film as the source electrode 7 on the upper surface of the interlayer insulating film 20 and the upper surface of the exposed source region 4, by appropriately using a barrier metal made of titanium or a titanium compound such as titanium nitride (TiN) (Step ST03).

The inventors have confirmed that the barrier metal not only suppresses alloying of the aluminum and the aluminum alloy with the drift layer 2 made of SiC, but also suppresses the corrosion into the drift layer 2 by the souse electrode 10 upon forming the source electrode 10 described later.

At this time, the tapered concave portion 8 is formed on the upper surface of the source electrode 7. The angle θ between the side surface of the tapered concave portion 8 illustrated in FIG. 8 and the upper surface of the SiC substrate 1 is adjustable by appropriately performing the heat treatment at 350° C. or higher and 500° C. or lower after the source electrode 7 is formed. Specifically, while the angle θ can be reduced by increasing the heating time at a temperature exceeding 400° C., the angle θ can be increased by shortening the heating time at a temperature of 400° C. or lower.

The shapes of the corner and the tapered portion of the tapered concave portion 8 are also adjustable to a shape having rounded corners as illustrated in FIG. 2 or FIG. 3 by appropriately performing the heat treatment at 350° C. or higher and 500° C. or lower after the source electrode 7 is formed.

Figure 9:
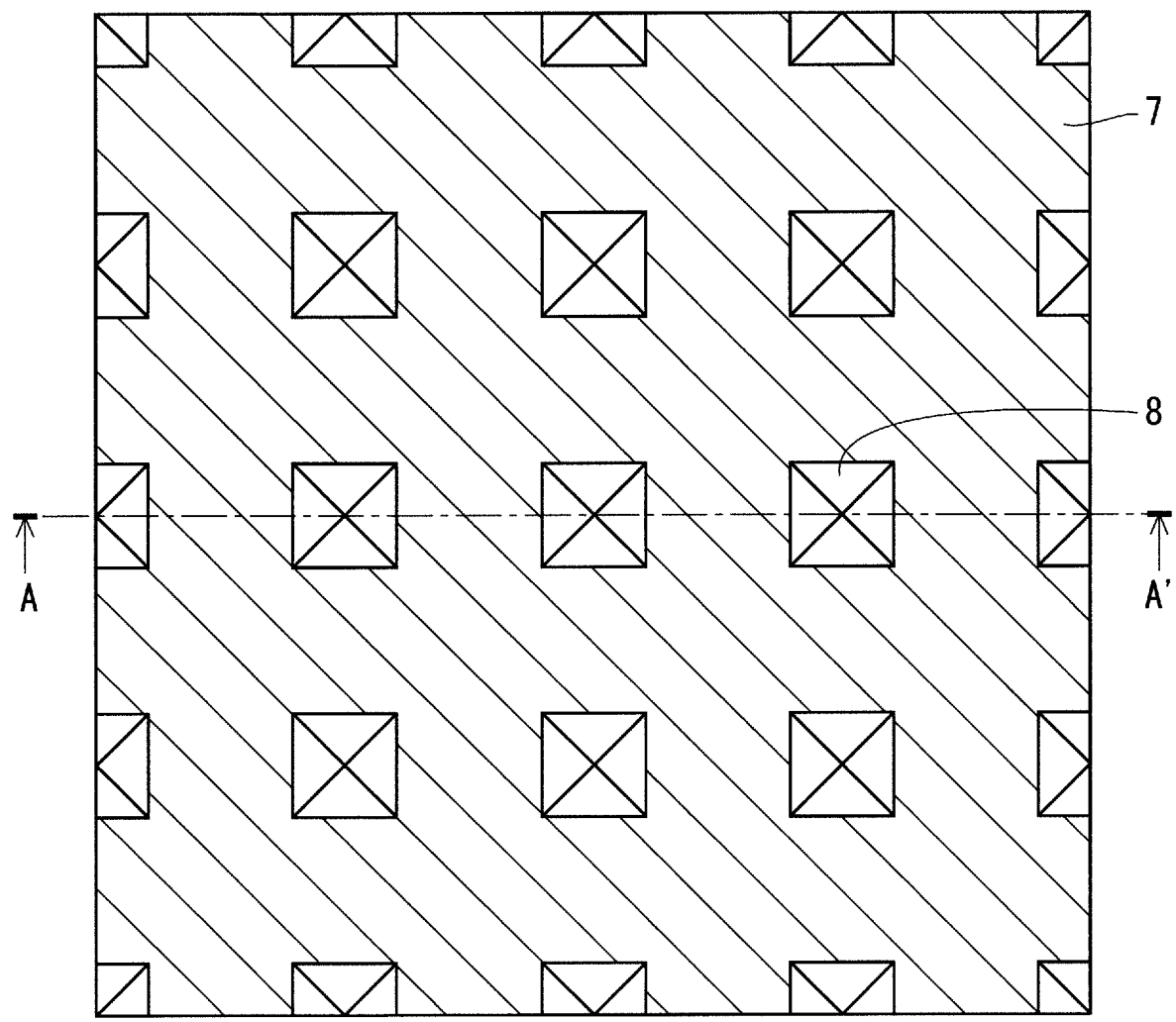
FIG. 9 A plan view of the structure whose example is illustrated in FIG. 8 after forming a source electrode.

FIG. 9 is a plan view of the structure whose example is illustrated in FIG. 8 after the source electrode 7 is formed. FIG. 8 corresponds to a cross-sectional view taken along the line A-A' in FIG. 9.

Thereafter, the lower surface of the SiC substrate 1 is subjected to mechanical processing using a grinding stone composed of, for example, alumina abrasive grains or diamond abrasive grains to polish the SiC substrate 1, if necessary. Then, the SiC substrate 1 is thinned (Step ST04).

Thereafter, a nickel film of about 600 nm is formed on the lower surface of the SiC substrate 1 by a sputtering method or the like as appropriate. By doing so, the drain electrode 9 is formed (Step ST05).

In addition, when the outermost surface of the nickel film is oxidized, the wettability between the solder alloy and nickel deteriorates, which leads to deterioration of bonding state at the time of soldering. Therefore, metal having low reactivity with the outside, such as gold or silver, may be formed as a protective film on the surface of the nickel film, and a laminated film including the nickel film and the protective film may be used as the drain electrode 9.

Next, the plating pretreatment is performed on the upper surface of the source electrode 7 (Step ST06). When the source electrode 7 is made of an aluminum alloy, even if the upper surface of the aluminum alloy is subjected to plating treatment, which is a wet film forming method, after performing generally known degreasing and pickling, a plating layer with strong adhesion cannot be formed, because a strong organic residue and an oxide film are formed on the upper surface of the aluminum alloy and metal diffusion between the aluminum alloy and the plating metal does not sufficiently occur, Therefore, in the above-described plating pretreatment, prior to the plating treatment on the upper surface of the source electrode 7, surface activation treatment, degreasing treatment, pickling, and zincate treatment are sequentially performed, and thereafter, the plating treatment, which is a wet film forming method, is performed. In addition, securing a sufficient washing time between each step is required so that the processing solution or residue from the previous step cannot be carried into the next step.

Figure 10:
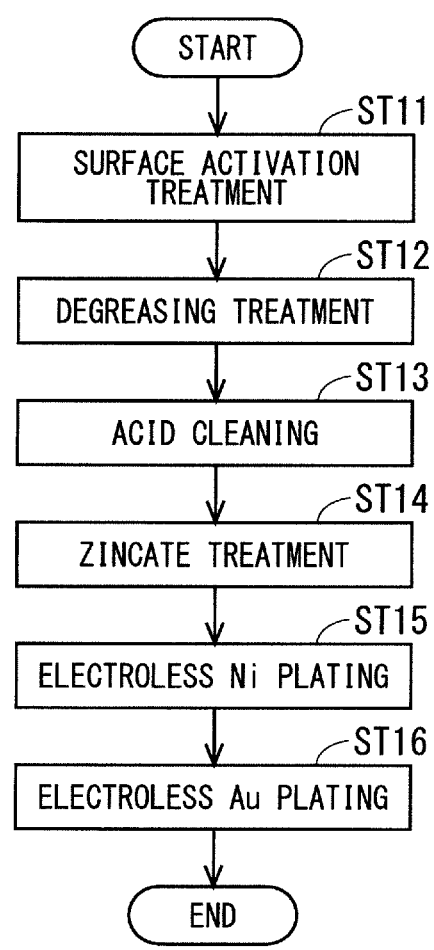
FIG. 10 A flowchart illustrating an example of the process of plating pretreatment according to Embodiment.

Next, the specific description of the plating pretreatment according to Embodiment 1 will be given with reference to FIG. 10. FIG. 10 is a flowchart illustrating an example of the process of plating pretreatment according to Embodiment 1.

First, the surface activation treatment (Step ST11) is performed. The surface activation treatment is performed with, for example, plasma. In particular, the plasma cleaning is treatment in which the upper surface of the source electrode 7 is cleaned by oxidizing and decomposing or driving out the organic residue burned and stuck on the source electrode 7, which cannot be removed by general plating pretreatment, with plasma.

Next, the degreasing treatment (Step ST12) and the acid cleaning (Step ST13) are performed. The degreasing treatment is performed to remove light organic contamination or oxide film remaining on the upper surface of the source electrode 7. The acid cleaning neutralizes the upper surface of the source electrode 7 and roughens the surface by etching. With the step, the reactivity to the processing solution in the subsequent step can be enhanced, and the adhesion of plating can be improved.

Next, the zincate treatment (Step ST14) is performed. Then, a plating film having a strong adhesion is formed by performing the plating treatment, which is a wet film forming method.

The zincate treatment will be described in detail. The zincate treatment is treatment for forming a zinc (Zn) film while removing the aluminum oxide film on the upper surface of the aluminum alloy when the source electrode 7 is made of an aluminum alloy. Specifically, when an aluminum alloy is immersed in an aqueous solution in which zinc is dissolved as ions, aluminum dissolves as ions because zinc has a higher standard oxidation reduction potential than aluminum. The electrons generated at this time allow the zinc ions to receive the electrons on the upper surface of the aluminum alloy and form a zinc film on the upper surface of the aluminum alloy. At this time, the aluminum oxide film is removed.

Next, electroless an Ni plating is formed (Step ST15). When an aluminum alloy on which a zinc film is formed is immersed in an electroless Ni plating solution, nickel deposits on the upper surface of the aluminum alloy first because zinc has a lower standard oxidation reduction potential than nickel.

Subsequently, when the upper surface of the aluminum alloy is covered with nickel, nickel is deposits automatically and catalytically by the action of the reducing agent contained in the electroless Ni plating solution. However, during the automatic catalytic deposition, the components of the reducing agent are taken into the electroless Ni plating film, so that the electroless Ni plating film becomes an alloy. When the concentration of the reducing agent is high, the formed electroless Ni plating film becomes amorphous. Further, hypophosphorous acid is generally used as a reducing agent; therefore, the electroless Ni plating contains phosphorus (P).

Under such conditions, an electroless Ni plating film having a thickness of 5 μm is formed on the upper surface of the source electrode 7. After the electroless Ni plating is formed, an electroless Au plating is formed (Step ST16).

The substitution type electroless Au plating is formed on the upper surface of the electroless Ni plating by utilizing the function of replacing nickel and Au by the action of a complexing agent contained in the plating solution.

Since it is a substitution type, the reaction stops when the surface of nickel is covered with Au. Therefore, forming a thick film of the electroless Au plating is difficult, and the thickness is 0.1 μm at most, and generally the electroless Au plating of 0.05 μm are formed. However, when used for soldering, the thickness of Au plating is not too thin even with the above-mentioned value. The film made of the electroless Ni plating and the electroless the Au plating thus formed is used as the source electrode 10 (Step ST07).

FIG. 11 is a cross-sectional view illustrating an example of a configuration of the semiconductor module including a semiconductor device. As illustrated in FIG. 11, a semiconductor device 11 manufactured as described above has, for example, each of the upper and lower surfaces of the semiconductor device 11 is connected to the lead frames 13, for example, by using solders 12 and then, the semiconductor module is completed after sealed with the mold resin 14.

Figure 12:
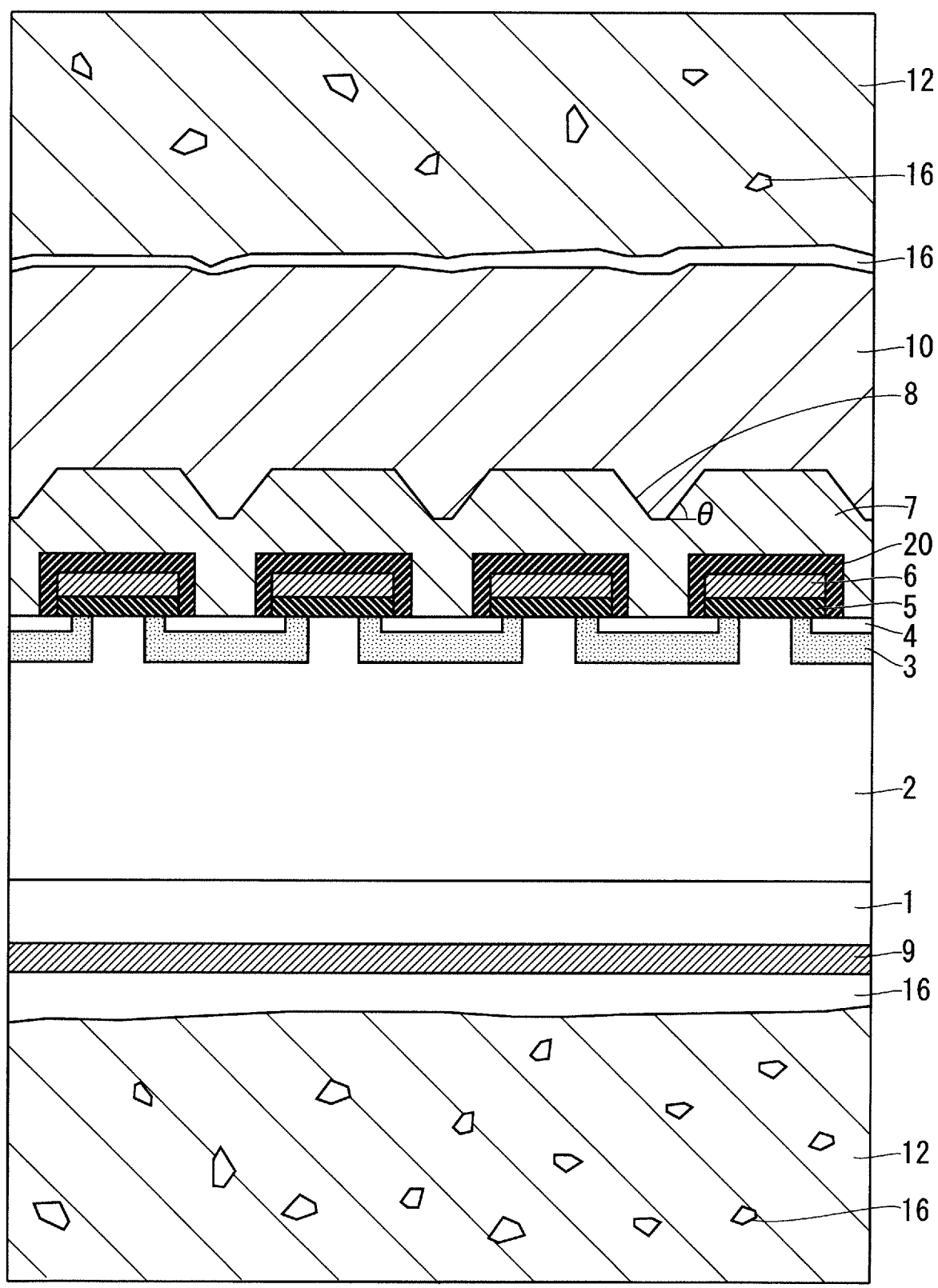
FIG. 12 A cross-sectional view of the semiconductor module whose example is illustrated in FIG. 11.

FIG. 12 is a cross-sectional view of the semiconductor module whose example is illustrated in FIG. 11. In FIG. 12, the source electrode 10 is formed on the upper surface of the source electrode 7, and an intermetallic compound 16 and the solder 12 are formed on an upper surface of the source electrode 10. Note that the intermetallic compound 16 is also diffused and formed in the solder 12.

On the other hand, the intermetallic compound 16 and the solder 12 are also formed on the lower surface of the drain electrode 9. Note that the intermetallic compound 16 is also diffused and formed in the solder 12.

FIG. 13 is a graph illustrating a change in the on-resistance of the semiconductor device after the rated current of the semiconductor module is intermittently applied, that is, after energization and cutoff are repeated, while repeatedly performing the ON operation and the OFF operation of the semiconductor device. In FIG. 13, the vertical axis indicates the change [%] of the on-resistance after the energization cycle, and the horizontal axis indicates the angle θ [°] between the side surface of the tapered concave portion 8 and the upper surface of the SiC substrate 1. Here, the rated current of the semiconductor module is 200 A, and the gate voltage applied to the gate electrode is 15 V when energized and −15 V when cut off. Further, in Embodiment 1, although the energization and cutoff cycle is repeated 100,000 times, the test conditions can be appropriately selected based on the usage conditions and the like of the semiconductor device.

When the angle θ between the side surface of the tapered concave portion 8 and the upper surface of the SiC substrate 1 is less than 5°, the on-resistance between the source electrode 7 and the source electrode 10 increases due to the influence of the stress caused by the mold resin and the like due to the energization cycle. On the other hand, when the angle θ between the side surface of the tapered concave portion 8 and the upper surface of the SiC substrate 1 is 5° or more, no increase in the on-resistance is observed even after the energization cycle, and a stable on-state is maintained.

When the bottom surface of the tapered concave portion 8 has a round shape, the angle θ indicates an angle between a tangent line to the side surface of the tapered concave portion 8 and the upper surface of the SiC substrate 1.

Although the tendency when the thickness of the source electrode 7 is 5 μm is illustrated in FIG. 13, the same tendency has been observed when the thickness of the source electrode 7 is 1 μm.

Further, when the angle θ between the side surface of the tapered concave portion 8 and the upper surface of the SiC substrate 1 exceeded 60°, an increase in the on-resistance was observed after the energization cycle. That is, when the angle θ between the side surface of the tapered concave portion 8 and the upper surface of the SiC substrate 1 is 60° or lower, an increase in the on-resistance was not observed after the energization cycle. Specifically, when the angle θ is 65°, the on-resistance is about 580%, and when the angle θ is 70°, the on-resistance is about 1000%.

When the angle θ is 65°, partial exfoliation was observed at the interface between the source electrode 7 formed of the AlSi alloy and the source electrode 10 formed of NiP plating, when observing the source electrode portion after the on-resistance is increased.

When the angle θ is 70°, the degree of exfoliation at the interface between the source electrode 7 and the source electrode 10 worsened than when the angle is 65°, when the source electrode portion is observed after the on-resistance is increased. Thus, the angle θ of the tapered concave portion 8 formed by the source electrode 7 is preferably 5° or more and 60° or less.

Even when the bottom surface of the tapered concave portion 8 has a round shape, no change in the above tendency was observed; therefore, the inventors have clarified that the angle θ between the side surface of the tapered concave portion 8 and the upper surface of the SiC substrate 1 contributes to the relaxation of the stress caused by the mold resin and the like in the energization cycle in their verification.

Further, the inventors have found that the opening width of the tapered concave portion 8 is preferably 0.1 μm or more and 4 μm or less, and the depth of the tapered concave portion 8 is preferably 0.2 μm or more and 2 μm or less.

Figure 14:
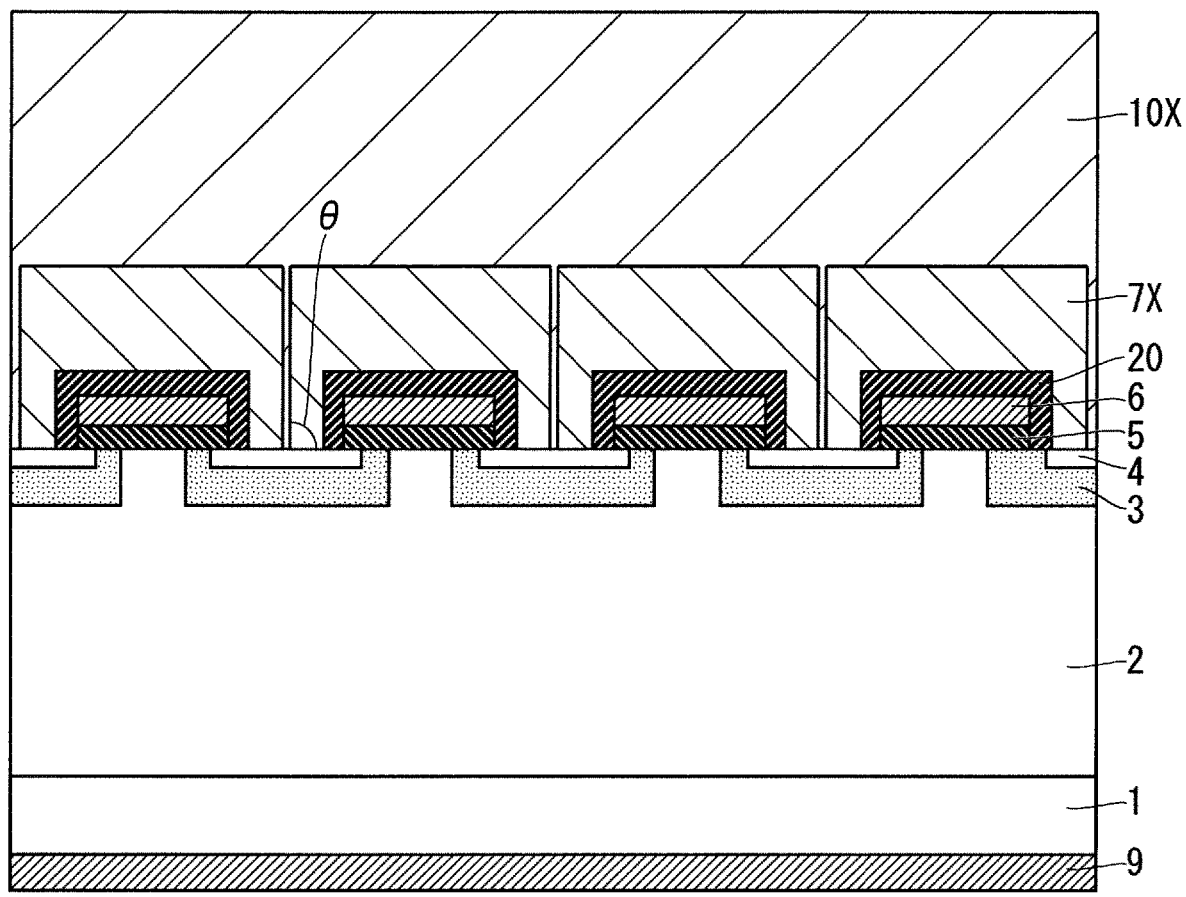
FIG. 14 A cross-sectional view illustrating an example of a configuration of the semiconductor device after the on-resistance has increased.

FIG. 14 is a cross-sectional view illustrating an example of the configuration of the semiconductor device after the on-resistance has increased when the angle θ between the side surface of the tapered concave portion 8 and the upper surface of the SiC substrate 1 is 90°.

As illustrated in the example in FIG. 14, when observing the source electrode portion after the on-resistance increases, the source electrode 7X is deformed and the source electrode 10X is directly connected to the source region 4. Then, based on the result of the heat generation analysis, leaking of a current was confirmed between the gate electrode 6 and the source electrode 10X due to the fact that the source electrode 10X is directly connected to the source region 4, and that normal operation was not performed was found.

FIG. 15 is a graph illustrating an example of the relationship between the number of repetitions of the tapered concave portion 8 formed on the upper surface of the source electrode 7 and the change in the on-resistance after the energizing cycle. In FIG. 15, the vertical axis indicates the on-resistance, and the horizontal axis indicates the number of repetitions [portions] of the tapered concave portion 8.

As illustrated in the example in FIG. 15, setting the number of repetitions of the tapered concave portion 8 to 100 or more portions allows the on-resistance after the energization cycle to be stabilized. That is, the connection between the source electrode 7 and the source electrode 10 can be stabilized by setting the number of repetitions of the tapered concave portion 8 to 100 or more portions.

Note that the number of tapered concave portions 8 formed on the upper surface of the source electrode 7 in FIG. 15 is the number of concave portions excluding the minute concave portions described later.

Further, in Embodiment 1, although a SiC-MOSFET having a planar gate structure is illustrated as an example, a SiC-MOSFET having a trench gate structure has a cross-sectional shape illustrated in FIG. 27 and is adoptable in the same manner as Embodiment 1 with the planer gate structure.

The configuration illustrated in FIG. 27 is a SiC-MOSFET having a trench gate structure, and a cell structure of a main part thereof. As the overall configuration of the semiconductor device, the configuration illustrated in FIG. 27 is extended in the left-right direction of FIG. 27.

As illustrated in FIG. 27, the semiconductor device includes an n-type SiC substrate 1, an n-type drift layer 2Y formed on the upper surface of the SiC substrate 1, a p-type base region 3Y formed on the surface layer of the drift layer 2Y, an n-type source region 4Y selectively formed on the surface layer of the base region 3Y, a trench 400 extending from the upper surface of the source region 4Y to the base region 3Y, and reaching the drift layer 2Y, a gate insulating film 5Y formed on the inner wall of the trench 400, inside the trench 400, a gate electrode 6Y formed via the gate insulating film 5Y on a side surface of the base region 3Y sandwiched between the source region 4Y and the drift layer 2Y, an interlayer insulating film 20Y formed over the gate electrode 6Y, a source electrode Y7 formed over the upper surface of the interlayer insulating film 20Y, the upper surface of the exposed source region 4Y, and the upper surface of the base region 3Y, a source electrode 10Y formed on the upper surface of the source electrode 7Y, and a drain electrode 9 formed on the lower surface of SiC substrate 1.

Here, a tapered concave portion 8Y is formed on the upper surface of the source electrode 7Y, and each side surface of the tapered concave portion 8Y has a tapered shape. Note that the angle between the side surface of the tapered concave portion 8Y and the upper surface of the SiC substrate 1 is defined as an angle θ. Further, the source electrode 10Y is formed over the inside of the tapered concave portion 8Y, that is, the upper surface including the inside of the tapered concave portion 8Y.

The taper angle θ is smaller than the angle formed between the interlayer insulating film 20Y and the drift layer 2Y.

Figure 33:
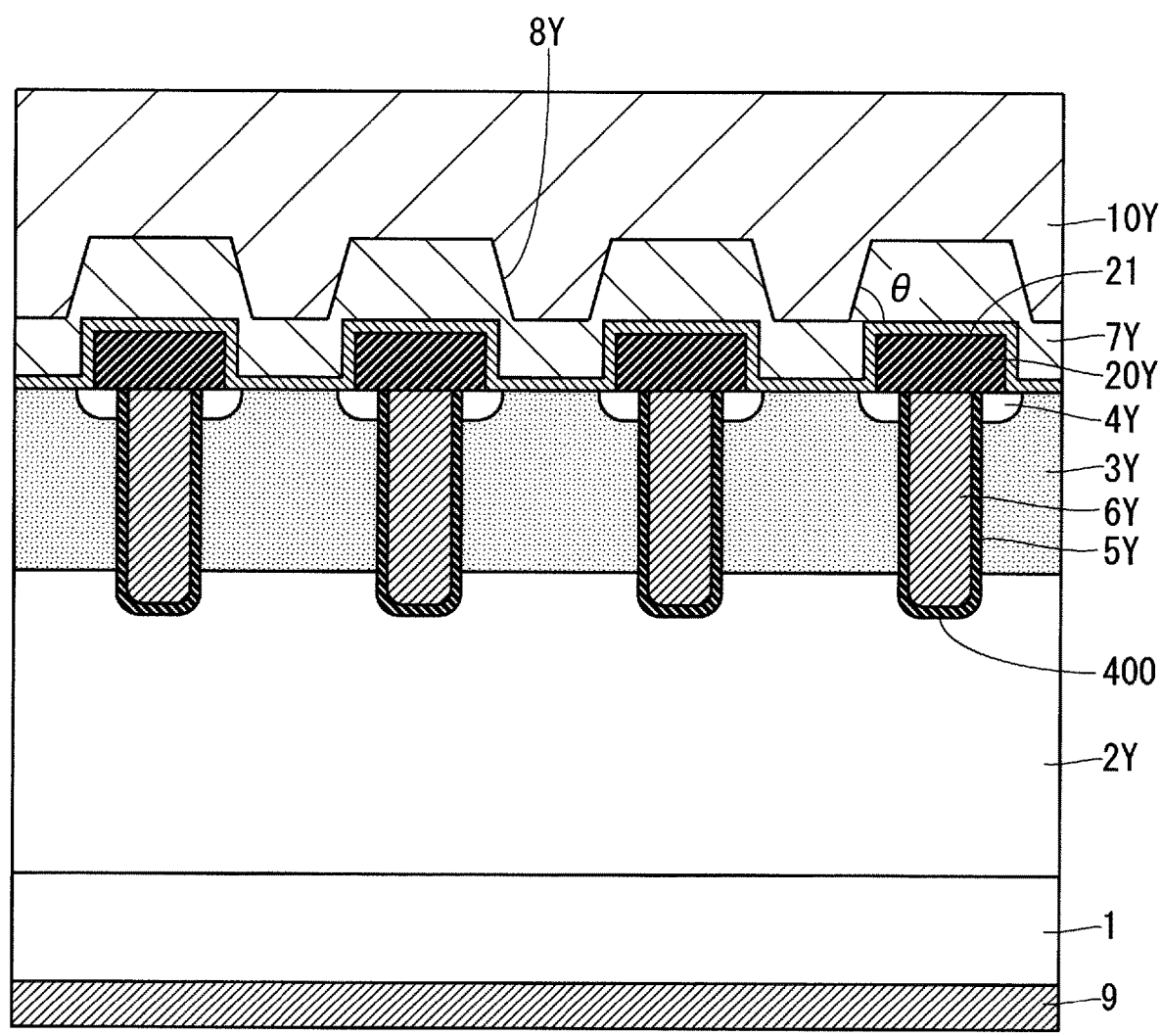
FIG. 33 A cross-sectional view schematically illustrating an example of the configuration of the semiconductor device illustrated in FIG. 27 further including a barrier metal.

Further, FIG. 33 is a cross-sectional view schematically illustrating an example of a configuration of the semiconductor device illustrated in FIG. 27 further including barrier metal.

As illustrated in FIG. 33, the semiconductor device includes an n-type SiC substrate 1, a drift layer 2, a base region 3Y, a source region 4Y, a gate electrode 6Y formed via a gate insulating film 5Y, an interlayer insulating film 20Y, a barrier metal 21 formed over the upper surface of the interlayer insulating film 20Y and the upper surface of the exposed source region 4Y, a source electrode 7Y formed over the upper surface and the side surfaces of the barrier metal 21, a source electrode 10Y, and a drain electrode 9.

Embodiment 2

A semiconductor device and a method of manufacturing the semiconductor device according to Embodiment 2 are described. In the following description, the same components in Embodiment described above are illustrated in the drawings with the same reference numerals, and detailed description thereof is appropriately omitted.

<Configuration of Semiconductor Device>

Figure 16:
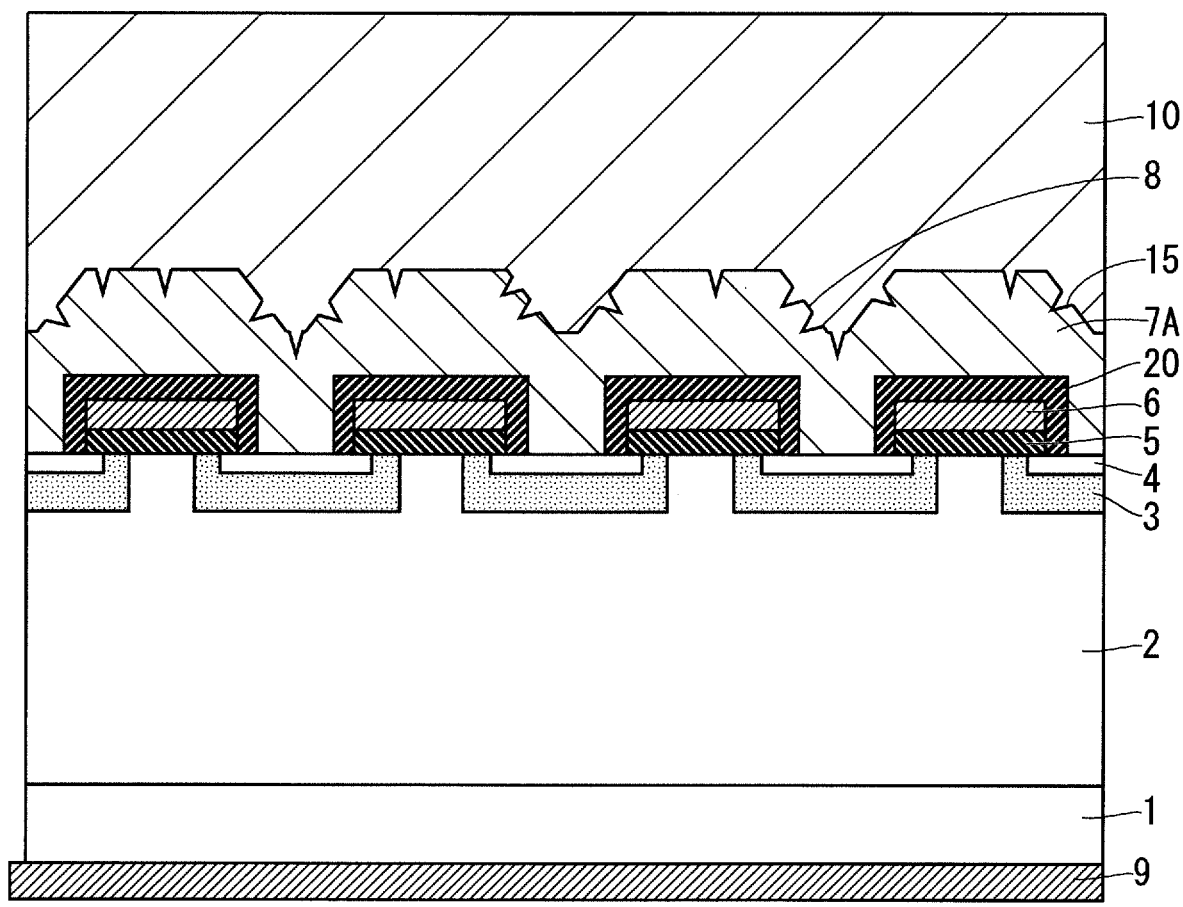
FIG. 16 A cross-sectional view schematically illustrating an example of a configuration of a semiconductor device according to Embodiment.

FIG. 16 is a cross-sectional view schematically illustrating an example of a configuration of a semiconductor device according to Embodiment 2. FIG. 16 illustrates a case where SiC is used for a semiconductor substrate. The configuration illustrated in FIG. 16 is a SiC-MOSFET having a planar gate structure, and a cell structure of a main part thereof. As the overall configuration of the semiconductor device, the configuration illustrated in FIG. 16 is extended in the left-right direction of FIG. 16.

As illustrated in FIG. 16, the semiconductor device includes an n-type SiC substrate 1, an n-type drift layer 2, a p-type base region 3, an n-type source region 4, a gate electrode 6 formed via a gate insulating film 5, an interlayer insulating film 20, a source electrode 7A, a source electrode 10, and a drain electrode 9.

Here, a tapered concave portion 8 is formed on the upper surface of the source electrode 7A and the angle between the side surface of the tapered concave portion 8 and the upper surface of the SiC substrate 1 is defined as an angle θ. Further, a minute concave portion 15 which is smaller than the tapered concave portion 8 is formed inside of the tapered concave portion 8 of the source electrode 7A, that is, the upper surface including the inside of the tapered concave portion 8.

FIG. 17 is an enlarged cross-sectional view illustrating a part of a structure including a source electrode 7A of the semiconductor device whose example is illustrated in FIG. 16. As illustrated in FIG. 17, it is assumed that the width W of the opening portion of the tapered concave portion 8 is 0.1 µm or more, and the width W of the opening portion of the minute concave portion 15 is less than 0.1 µm.

And, in the configuration illustrated in FIG. 16, the minute concave portion 15 is also formed in the tapered concave portion 8; therefore, the bottom surface of the tapered concave portion 8 in the configuration illustrated in FIG. 16 has fewer flat parts than the bottom surface of the tapered concave portion 8 in the configuration whose example is illustrated in FIG. 8.

Figure 32:
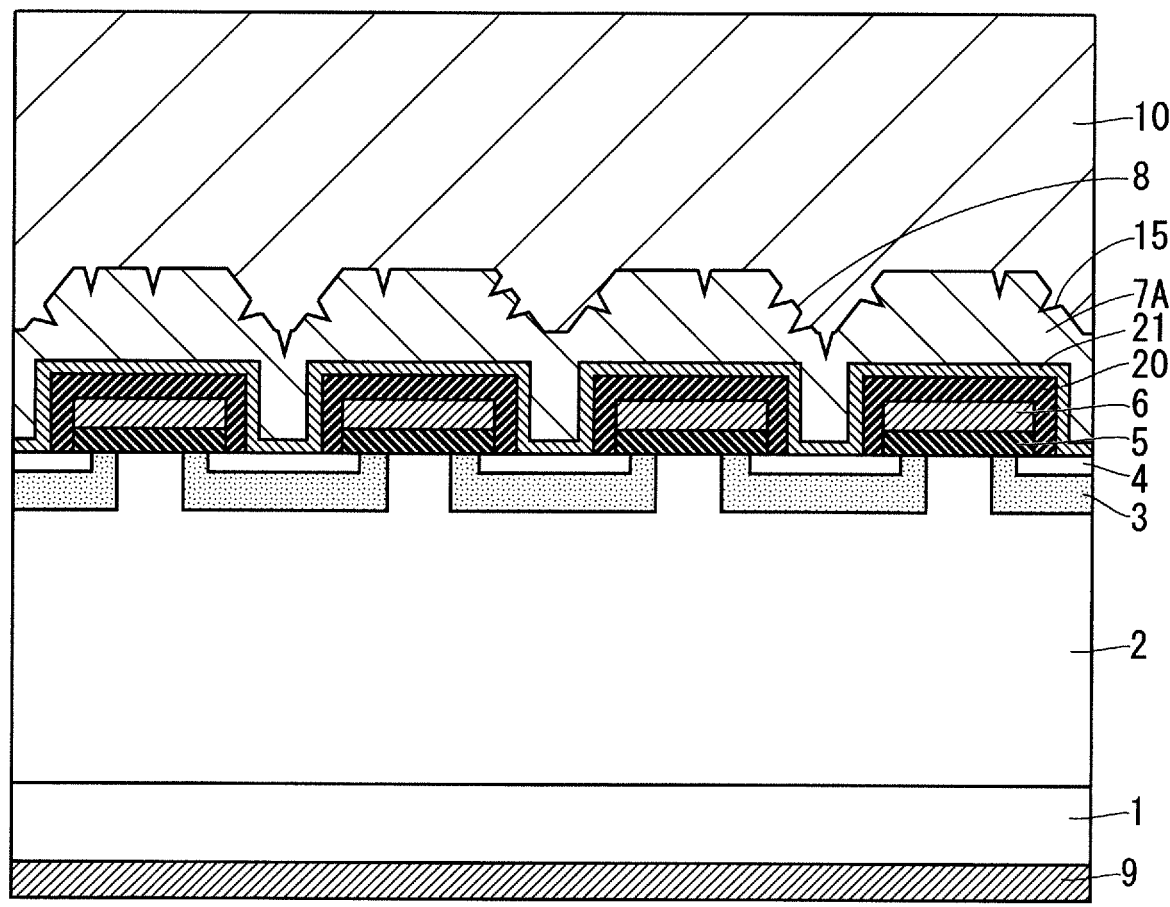
FIG. 32 A cross-sectional view schematically illustrating an example of the configuration of the semiconductor device illustrated in FIG. 16 further including a barrier metal.

FIG. 32 is a cross-sectional view schematically illustrating an example of a configuration of the semiconductor device illustrated in FIG. 16 further including barrier metal described later.

As illustrated in the example in FIG. 32, the semiconductor device includes an n-type SiC substrate 1, a drift layer 2, a base region 3, a source region 4, a gate electrode 6 formed via a gate insulating film 5, an interlayer insulating film 20, a barrier metal 21 formed over the upper surface of the interlayer insulating film 20 and the upper surface of the exposed source region 4, a source electrode 7A formed over the upper surface and the side surfaces of the barrier metal 20, a source electrode 10, and a drain electrode 9.

<Manufacturing Method of Semiconductor Device>

The manufacturing process of the semiconductor device according to Embodiment 2 is the same as the manufacturing process illustrated in FIG. 5 up to Step ST05.

That is, first, the drift layer 2 made of n-type SiC is epitaxially grown on the upper surface of the n-type SiC substrate 1 (Step ST01). Next, after forming a mask (not illustrated here) made of a resist or the like, ion implantation of impurities is performed. Then, the p-type base region 3 is selectively formed on the surface layer of the drift layer 2.

Thereafter, after forming a mask made of a resist or the like, ion implantation of impurities is performed for each of the p-type base regions 3. Then, the n-type source region 4 is selectively formed on the surface layer of the base region 3.

Thereafter, the SiC substrate 1 is subject to heat treatment at a high temperature by a heat treatment device in order to activate the base region 3 and the source region 4.

Next, the gate insulating film 5 is formed on the upper surface of the source region 4, the upper surface of the base region 3, and the upper surface of the drift layer 2 by a deposition method such as a thermal oxidation method or chemical vapor deposition. Next, the gate electrode 6 is formed on the upper surface of the gate insulating film 5, and the gate electrode 6 is patterned. The patterned gate electrode 6 is formed on the upper surface of the base region 3 interposed between the source region 4 and the drift layer 2.

Thereafter, the remaining portion of the gate insulating film 5 on the upper surface of the source region is removed by a photolithography technique and an etching technique. Then, the interlayer insulating film 20 is formed, and further, the interlayer insulating film 20 is patterned (Step ST02).

Next, aluminum, an aluminum alloy made of aluminum and silicon, or nickel is deposited to form a film as the source electrode 7A on the upper surface of the interlayer insulating film 20 and the upper surface of the exposed source region 4, by appropriately using a barrier metal made of titanium or a titanium compound such as titanium nitride (TiN) (Step ST03).

The barrier metal not only suppresses alloying of the drift layer 2 made of aluminum and the aluminum alloy described above with SiC. The inventors have confirmed that, when a minute concave portion is formed on the source electrode 10 described later, in Embodiment 2, the corrosion into the drift layer 2 when performing the zincate treatment or forming the source electrode 10 is sufficiently suppressed. At this time, the tapered concave portion 8 is formed on the upper surface of the source electrode 7A.

Thereafter, the lower surface of the SiC substrate 1 is subjected to mechanical processing using a grinding stone composed of, for example, alumina abrasive grains or diamond abrasive grains to polish the SiC substrate 1, if necessary. Then, the SiC substrate 1 is thinned (Step ST04).

Thereafter, a nickel film of about 600 nm is formed on the lower surface of the SiC substrate 1 by a sputtering method or the like as appropriate. By doing so, the drain electrode 9 is formed (Step ST05).

Next, the plating pretreatment is performed on the upper surface of the source electrode 7A (Step ST06). In the plating pretreatment, prior to the plating treatment on the upper surface of the source electrode 7A, surface activation treatment, degreasing treatment, pickling, and a plurality of times of zincate treatment are sequentially performed, and thereafter, the plating treatment is performed. In addition, securing a sufficient washing time between each step is required so that the processing solution or residue from the previous step cannot be carried into the next step.

Figure 18:
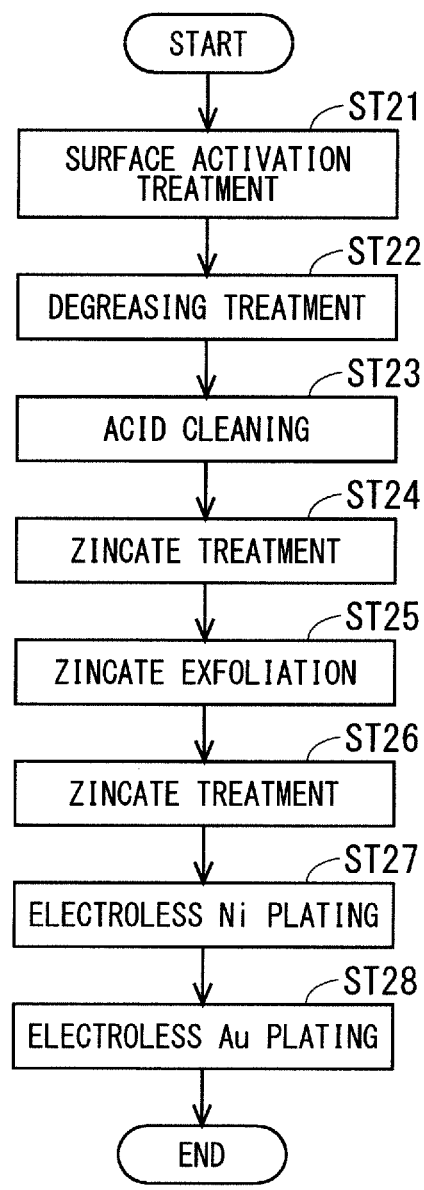
FIG. 18 A flowchart illustrating an example of the process of plating pretreatment according to Embodiment.
Figure 19:
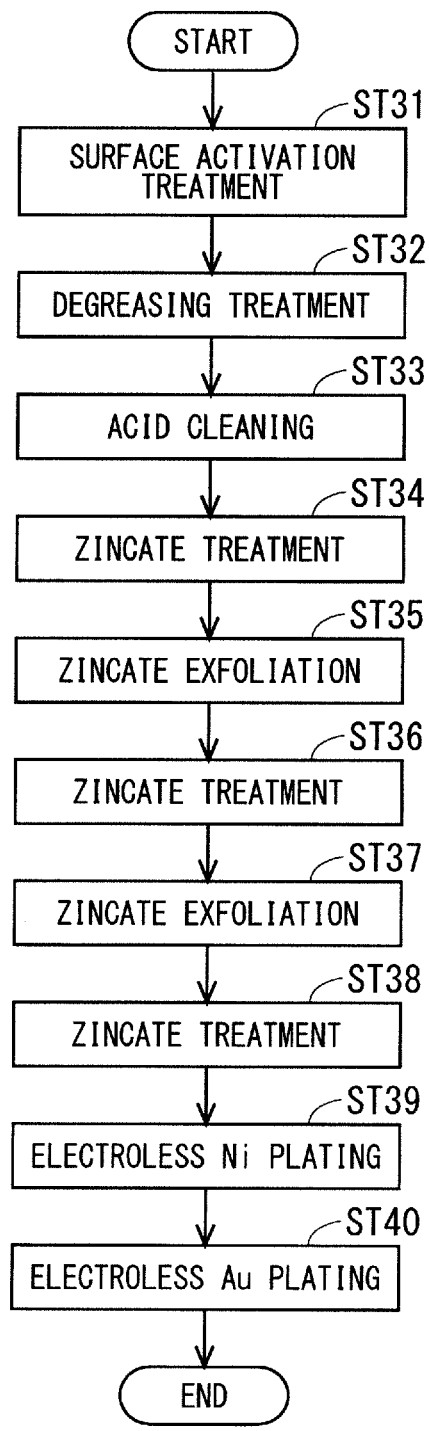
FIG. 19 A flowchart illustrating an example of the process of plating pretreatment according to Embodiment.

Next, the specific description of the plating pretreatment according to Embodiment 2 will be given with reference to FIGS. 18 and 19. FIGS. 18 and 19 are flowcharts illustrating examples of the process of plating pretreatment according to Embodiment 2.

First, the surface activation treatment (Step ST21, Step ST31) is performed. The surface activation treatment is performed with, for example, plasma. In particular, the plasma cleaning is treatment to clean the upper surface of the source electrode 7A, in which the organic residue burned and stuck on the source electrode 7A, which cannot be removed by general plating pretreatment, is cleaned by oxidizing and decomposing, or driving out thereof with plasma.

Next, the degreasing treatment (Step ST22, Step ST32), and then pickling (Step ST23, Step ST33) are performed. The degreasing treatment is performed to remove light organic contamination or oxide film remaining on the upper surface of the source electrode 7A. The acid cleaning neutralizes the upper surface of the source electrode 7A and roughens the surface by etching.

Next, the zincate treatment (Step ST24, Step ST34) is performed. As described in Embodiment 1, the zincate treatment is treatment for forming a zinc (Zn) film while removing the aluminum oxide film on the upper surface of the aluminum alloy when the source electrode 7A is made of an aluminum alloy. Specifically, when an aluminum alloy is immersed in an aqueous solution in which zinc is dissolved as ions, aluminum dissolves as ions because zinc has a higher standard oxidation reduction potential than aluminum. The electrons generated at this time allow the zinc ions to receive the electrons on the upper surface of the aluminum alloy and form a zinc film on the upper surface of the aluminum alloy. At this time, the aluminum oxide film is removed.

Then, as zincate exfoliation, the zinc-coated aluminum alloy is immersed in a concentrated nitric acid solution to dissolve zinc (Step ST25, Step ST35). Further, a thin and uniform aluminum oxide film is formed on the upper surface of the aluminum alloy.

Next, the zincate treatment (Step ST26, Step ST36) is performed again. Specifically, the aluminum alloy is immersed in an aqueous solution in which zinc is dissolved as ions, and the upper surface of the aluminum alloy is coated with zinc. At this time, the aluminum oxide film is removed.

By performing above-described zincate treatment twice, the thickness of the aluminum oxide film formed on the upper surface of the aluminum alloy becomes thin and smooth. The more the number of times the zincate treatment is performed, the more uniform the thickness of the aluminum oxide film on the upper surface of the aluminum alloy becomes, the quality of the plating film formed in later steps (i.e., uniformity or smoothness of the plating film thickness) is improved; however, to take into account the productivity, the limit of the number of times the zincate treatment is performed is two or three at most.

In the case of performing the zincate treatment three times, as illustrated in an example in FIG. 19, the zincate exfoliation is performed again, specifically, the zinc-coated aluminum alloy is immersed in concentrated nitric acid solution to dissolve the zinc (Step ST37). Further, a thin and uniform aluminum oxide film is formed on the upper surface of the aluminum alloy. Next, the zincate treatment is performed further (Step ST38). Specifically, the aluminum alloy is immersed in an aqueous solution in which zinc is dissolved as ions, and the upper surface of the aluminum alloy is coated with zinc. At this time, the aluminum oxide film is removed.

As described above, by performing the zincate treatment and the zincate exfoliation, minute concave portions 15 can be formed on the upper surface of the source electrode 7A as illustrated in FIG. 16.

At this time, since a minute concave portion is formed perpendicular to the slope of the source electrode 7A, the minute concave portion is not always parallel to the vertical direction of the drawing.

The opening portion of the minute concave portion 15 has, for example, a width W of 0.01 μm or more and less than 0.1 μm, and a depth of 0.01 μm or more and 0.5 μm or less. Further, the minute concave portion 15 can be formed in a region immediately above the gate electrode 6 and inside the tapered concave portion 8 of the source electrode 7A.

Next, an electroless Ni plating is formed (Step ST27, Step ST39). Specifically, an electroless Ni plating film having a thickness of 5 μm is formed on the upper surface of the source electrode 7A. And, after the electroless Ni plating is formed, an electroless Au plating is formed (Step ST28, Step ST40). The film made of the electroless Ni plating and the electroless Au plating thus formed is used as the source electrode 10.

Figure 20:
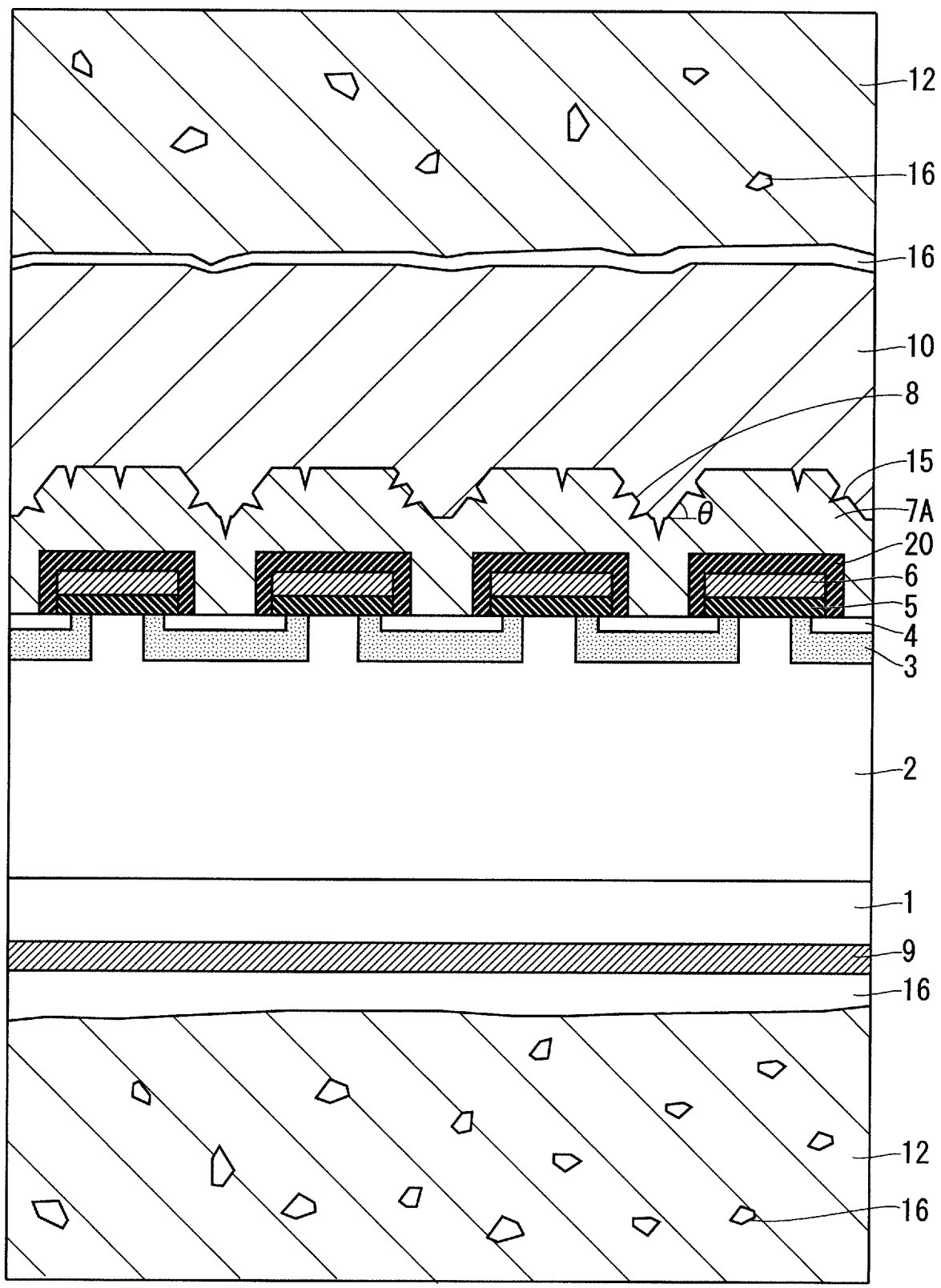
FIG. 20 A cross-sectional view of the semiconductor module according to Embodiment.

FIG. 20 is a cross-sectional view of the semiconductor module manufactured through the above-described manufacturing process. In FIG. 20, the source electrode 10 is formed on the upper surface of the source electrode 7A, and an intermetallic compound 16, and further, the solder 12 are formed on an upper surface of the source electrode 10. Note that the intermetallic compound 16 is also diffused and formed in the solder 12.

On the other hand, the intermetallic compound 16, and further, the solder 12 are also formed on the lower surface of the drain electrode 9. Note that the intermetallic compound 16 is also diffused and formed in the solder 12.

The degree of hardness of the intermetallic compound 16 is relatively high; therefore, when the ON operation and the OFF operation of the semiconductor device are repeated, a large stress is applied to the intermetallic compound 16 by repetitive heating and cooling the electrode portion. Then, destruction may occur in the source electrode.

FIG. 21 is a graph illustrating a change in the on-resistance of the semiconductor device after the rated current of the semiconductor module is intermittently applied, that is, after energization and cutoff are repeated. In FIG. 21, the vertical axis indicates the change [%] of the on-resistance after the energization cycle, and the horizontal axis indicates the angle θ [°] between the side surface of the tapered concave portion 8 and the upper surface of the SiC substrate 1. Here, the rated current of the semiconductor module is 200 A, and the gate voltage applied to the gate electrode is 15 V when energized and −15 V when cut off. Further, in Embodiment 2, although the energization and cutoff cycle is repeated 100,000 times, the test conditions can be appropriately selected based on the usage conditions and the like of the semiconductor device.

Further, in FIG. 21, the dotted line plot indicates a case where the minute concave portions 15 are not formed, that is, a change in resistance in an energization test for the configuration illustrated in FIG. 12, and the solid line plot indicates a case where the minute concave portions 15 are formed, that is, a change in resistance in an energization test for the configuration illustrated in FIG. 20.

According to FIG. 21, with the suppression of the change in resistance in the configuration in which the minute concave portions 15 are formed, it is clarified that the minute concave portions 15 contribute to the relaxation of the stress caused by the mold resin and the like in the energization cycle.

Also in Embodiment 2, setting the number of repetitions of the tapered concave portion 8 to 100 or more portions allows the on-resistance after the energization cycle to be stabilized. That is, the connection between the source electrode 7A and the source electrode 10 can be stabilized by setting the number of repetitions of the tapered concave portion 8 to 100 or more portions.

Embodiment 3

A semiconductor device and a method of manufacturing the semiconductor device according to Embodiment 3 are described. In the following description, the same components in Embodiments described above are illustrated in the drawings with the same reference numerals, and detailed description thereof is appropriately omitted.

<Configuration of Semiconductor Device>

Figure 22:
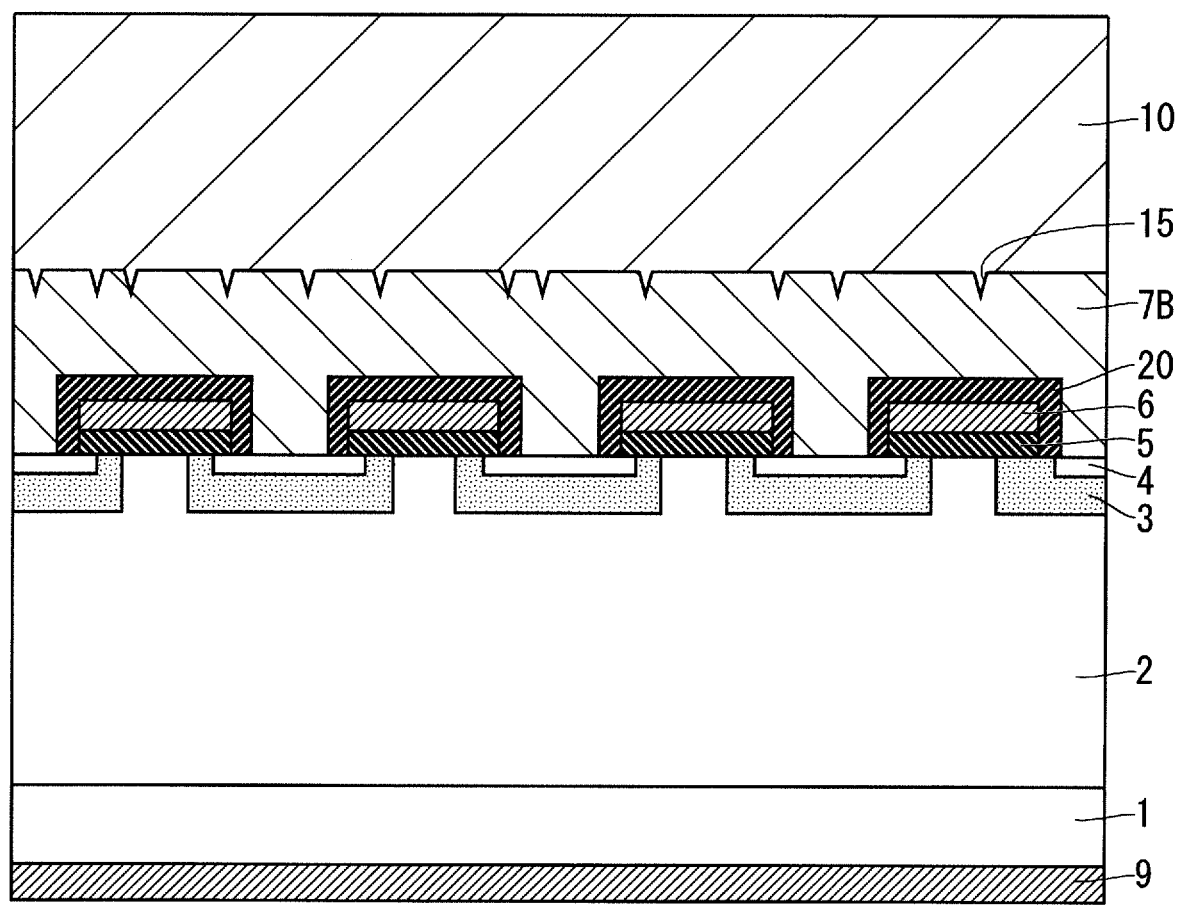
FIG. 22 A cross-sectional view schematically illustrating an example of a configuration of a semiconductor device according to Embodiment.

FIG. 22 is a cross-sectional view schematically illustrating an example of a configuration of a semiconductor device according to Embodiment 3. FIG. 22 illustrates a case where SiC is used for a semiconductor substrate. The configuration illustrated in FIG. 22 is a SiC-MOSFET having a planar gate structure, and a cell structure of a main part thereof. As the overall configuration of the semiconductor device, the configuration illustrated in FIG. 22 is extended in the left-right direction of FIG. 22.

As illustrated in FIG. 22, the semiconductor device includes an n-type SiC substrate 1, an n-type drift layer 2, a p-type base region 3, an n-type source region 4, a gate electrode 6 formed via a gate insulating film 5, an interlayer insulating film 20, a source electrode 7B, a source electrode 10, and a drain electrode 9.

Here, the minute concave portions 15 are formed on the upper surface of the source electrode 7B, and the tapered concave portions 8 are not formed. It is assumed that the minute concave portions 15 have an opening portion width W of less than 0.1 μm. The source electrode 10 is formed over the upper surface of the source electrode 7B including the inside of the minute concave portions 15.

<Manufacturing Method of Semiconductor Device>

The manufacturing process of the semiconductor device according to Embodiment 3 is the same as the manufacturing process illustrated in FIG. 5 up to Step ST05.

That is, first, the drift layer 2 made of n-type SiC is epitaxially grown on the upper surface of the n-type SiC substrate 1 (Step ST01). Next, after forming a mask made of a resist or the like, ion implantation of impurities is performed. Then, the p-type base region 3 is selectively formed on the surface layer of the drift layer 2.

Then, after forming a mask made of a resist or the like, ion implantation of impurities is performed for each of the p-type base regions 3. Then, the n-type source region 4 is selectively formed on the surface layer of the base region 3.

Thereafter, the SiC substrate 1 is subject to heat treatment at a high temperature by a heat treatment device in order to activate the base region 3 and the source region 4.

Next, the gate insulating film 5 is formed on the upper surface of the source region 4, the upper surface of the base region 3, and the upper surface of the drift layer 2 by a deposition method such as a thermal oxidation method or a chemical vapor deposition. Next, the gate electrode 6 is formed on the upper surface of the gate insulating film 5, and the gate electrode 6 is patterned. The patterned gate electrode 6 is formed on the upper surface of the base region 3 interposed between the source region 4 and the drift layer 2.

Next, the remaining portion of the gate insulating film 5 on the upper surface of the source region is removed by a photolithography technique and an etching technique. Then, the interlayer insulating film 20 is formed, and further, the interlayer insulating film 20 is patterned (Step ST02).

Next, aluminum, an aluminum alloy made of aluminum and silicon, or nickel is deposited to form a film as the source electrode on the upper surface of the interlayer insulating film 20 and the upper surface of the exposed source region 4, by appropriately using a barrier metal made of titanium or a titanium compound such as titanium nitride (TiN) (Step ST03).

The barrier metal not only suppresses the alloying of the drift layer 2 made of aluminum and the aluminum alloy described above with SiC. The inventors have confirmed that, when a minute concave portion is formed on the source electrode 10 described later, in Embodiment 3, the corrosion into the drift layer 2 when performing the zincate treatment or forming the source electrode 10 is sufficiently suppressed.

Figure 23:
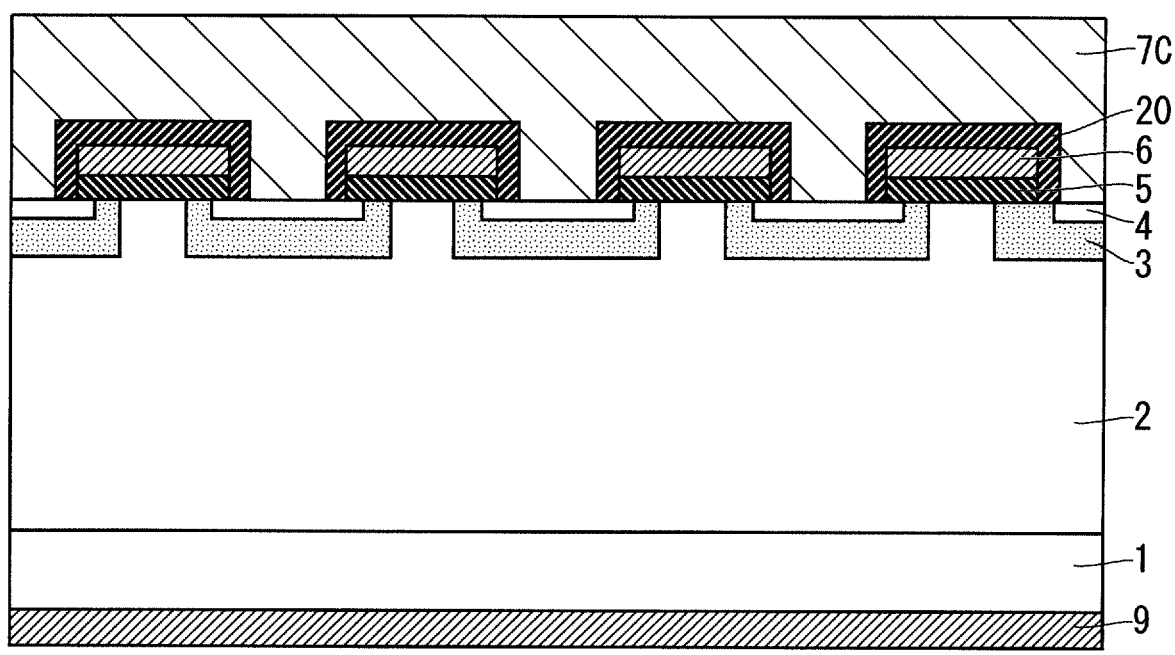
FIG. 23 A cross-sectional view illustrating an example of a configuration in which a source electrode having a flat upper surface is formed.

Then, by performing heat treatment at 250° C. or higher and 500° C. or lower during and after the formation of the source electrode, the source electrode 7C having a flat upper surface can be formed. FIG. 23 is a cross-sectional view illustrating an example of a configuration in which the source electrode 7C having a flat upper surface is formed.

And, FIG. 24 is a cross-sectional view illustrating an example of a configuration further including a bonding electrode. As illustrated in FIG. 24, after forming the gate electrode 6 and the interlayer insulating film 20, a bonding electrode 17 may be formed on the exposed upper surface of the source region 4 using a metal material such as tungsten or titanium. After forming the bonding electrode 17, the source electrode 7D having a flat upper surface can be formed.

As described above, forming the source electrode 7C or the source electrode 7D having a flat upper surface allows to facilitate forming a fine pattern on the upper surface of the source electrode 7C or the upper surface of the source electrode 7D; therefore, loss of the semiconductor device during operation can be suppressed, and a higher-performance semiconductor device can be manufactured.

Thereafter, the lower surface of the SiC substrate 1 is subjected to mechanical processing using a grinding stone composed of, for example, alumina abrasive grains or diamond abrasive grains to polish the SiC substrate 1, if necessary. Then, the SiC substrate 1 is thinned (Step ST04).

Thereafter, a nickel film of about 600 nm is formed on the lower surface of the SiC substrate 1 by a sputtering method or the like as appropriate. By doing so, the drain electrode 9 is formed (Step ST05).

Next, an electroless Ni plating is formed. Specifically, an electroless Ni plating film having a thickness of 5 μm is formed on the upper surface of the source electrode 7B. And after the electroless Ni plating is formed, the electroless Au plating is formed. The film made of the electroless Ni plating and the electroless Au plating thus formed is used as the source electrode 10.

When forming the above source electrode 10, similarly to the case of the example illustrated in Embodiment 2, by performing the zincate treatment and the zincate exfoliation, the minute concave portions 15 can be formed on the upper surface of the source electrode 7B as in the example illustrated in FIG. 22.

The opening portion of the minute concave portion 15 has, for example, a width W of 0.01 μm or more and less than 0.1 and a depth of 0.01 μm or more and 0.5 μm or less. Further, the minute concave portion 15 can be formed in a region including a region immediately above the gate electrode 6.

FIG. 25 is a table illustrates a change in the on-resistance of the semiconductor device manufactured through the above-described manufacturing process after energization and cutoff are repeated. Here, the rated current of the semiconductor module is 200 A, and the gate voltage applied to the gate electrode is 15 V when energized and −15 V when cut off. Further, in Embodiment 3, although the energization and cutoff cycle is repeated 100,000 times, the test conditions can be appropriately selected based on the usage conditions and the like of the semiconductor device.

According to FIG. 25, with the suppression of the change in resistance in the configuration in which one or more minute concave portions 15 per 1 μm$^2$ are formed, it is clarified that the minute concave portions 15 contribute to the relaxation of the stress caused by the mold resin and the like in the energization cycle.

Embodiment 4

A power conversion device and a method of manufacturing the power conversion device according to Embodiment 4 are described. In the following description, the same components in Embodiments described above are illustrated in the drawings with the same reference numerals, and detailed description thereof is appropriately omitted.

<Configuration of Power Conversion Device>

In Embodiment 4, the semiconductor devices according to the Embodiments described above are applied to a power conversion device. The power conversion device to be applied is not limited to a specific application, and a case where the power conversion device is applied to a three-phase inverter will be described below.

FIG. 26 is a diagram conceptually illustrating an example of a configuration of a power conversion system including a power conversion device according to Embodiment 4.

As illustrated in FIG. 26, the power conversion system includes a power supply 100, a power conversion device 200, and a load 300. The power supply 100 is a DC power supply and supplies DC power to the power conversion device 200. The power supply 100 can be composed of various types of components such as a DC system, a solar cell, a storage battery, or the like. Further, the power supply 100 can be composed of a rectifier circuit or an AC-DC converter connected to an AC system. Further, the power supply 100 may be composed of a DC-DC converter that converts DC power output from the DC system into predetermined power.

The power conversion device 200 is a three-phase inverter connected between the power supply 100 and the load 300. The power conversion device 200 converts the DC power supplied from the power supply 100 into AC power, and further supplies the AC power to the load 300.

Further, as illustrated in FIG. 26, the power conversion device 200 includes a conversion circuit 201 that convers DC power into AC power and outputs the AC power, a drive circuit 202 that outputs a drive signal for driving each switching element of the conversion circuit 201, and a control circuit 203 that outputs a control signal for controlling the drive circuit 202 to the drive circuit 202.

The load 300 is a three-phase electric motor driven by AC power supplied from the power conversion device 200. The load 300 is not limited to a specific use and is a motor mounted on various electric devices, such as a motor used in a hybrid vehicle, an electric vehicle, a railway vehicle, an elevator, and an air conditioner.

Hereinafter, the details of the power conversion device 200 will be described. The conversion circuit 201 includes switching elements and freewheeling diodes (not illustrated here). When the switching element performs a switching operation, the DC power supplied from the power supply 100 is converted into AC power, and the further supplies AC power to the load 300.

Although there are various specific circuit configurations of the conversion circuit 201, the conversion circuit 201 according to Embodiment 4 is a two-level three-phase full bridge circuit, and includes six switching elements and six freewheeling diodes each of which is anti-parallelly connected to the respective switching elements.

The semiconductor device according to any of Embodiments described above is applied to at least one of each switching element and each freewheeling diode in the conversion circuit 201. For two switching elements of the six switching elements are connected in series to form upper and lower arms, and each upper and lower arm forms each phase (i.e., U phase, V phase and W phase) of the full bridge circuit. The output terminals of each upper and lower arm (that is, the three output terminals of the conversion circuit 201) are connected to the load 300.

The drive circuit 202 generates a drive signal for driving the switching elements of the conversion circuit 201, and further supplies the drive signal to control electrodes of the switching elements of the conversion circuit 201. Specifically, based on the control signal output from a control circuit 203 described later, a drive signal for turning on the switching elements and a drive signal for turning off the switching elements are output to the control electrodes of the respective switching elements.

When the switching elements are maintained in the on state, the drive signal is a voltage signal equal to or higher than a threshold voltage of the switching elements (that is, an on signal), and when the switching elements are maintained in the off state, the drive signal is lower than the threshold voltage of the switching elements (that is, an off signal).

The control circuit 203 controls the switching elements of the conversion circuit 201 so that desired power can be supplied to the load 300. Specifically, based on the power to be supplied to the load 300, the time when each switching element of the conversion circuit 201 should be in the on state (that is, the on time) is calculated. For example, the conversion circuit 201 can be controlled by PWM control that modulates the on time of the switching elements according to the voltage to be output.

Then, the control circuit 203 issues a control command (that is, a control signal) to the drive circuit 202 such that an ON signal is output to a switching element to be turned on at each time and an OFF signal is output to a switching element to be turned off at each time. The drive circuit 202 outputs an ON signal or an OFF signal as a drive signal to the control electrode of each switching element based on the control signal.

In the power converter 200 according to Embodiment 4, the semiconductor device according to any of Embodiments described above is applied as a switching element of the conversion circuit 201; therefore, the on-resistance after the energization cycle can be stabilized.

Note that, in Embodiment 4, an example in which the semiconductor device of any of Embodiments described above is applied to a two-level three-phase inverter has been described, but the application example is not limited thereto. The semiconductor device of any of Embodiments described above can be applied to various power conversion devices.

Further, in Embodiment 4, although the two-level power converter has been described, the semiconductor device of any of Embodiments described above may be applied to a three-level or multi-level power converter. When power is supplied to a single phase load, the semiconductor device according to any of Embodiments described above may be applied to a single-phase inverter.

In the case where power is supplied to a DC load or the like, the semiconductor device according to any of Embodiments described above can be applied to a DC-DC converter or an AC-DC converter.

Further, the power conversion device to which the semiconductor device according to any of Embodiments described above is applied is not limited to the case where the above-described load is an electric motor, and can be used, for example, as a power supply device of an electric discharge machine, a laser beam machine, an induction heating cooker, or a non-contact power supply system. A power conversion device to which the semiconductor device in any of Embodiments described above is applied can also be used as a power conditioner in a solar power generation system, a power storage system, or the like.

<Effects of Above-Described Embodiments>

Next, an example of the effects of Embodiments described above will be illustrated. In the following description, effects are described based on the specific configurations illustrated in the Embodiments described above, however, other specific configurations may be applied in replace of the configurations illustrated in the specification, within the scope of producing the similar effects.

Also, the replacement may be implemented with a plurality of Embodiments. That is, a configuration in which the same effects are obtained by combining the respective configurations illustrated in different Embodiments may be employed.

According to Embodiments described above, the semiconductor device includes an n-type semiconductor layer, an upper surface structure formed on at least a surface layer of the semiconductor layer, and an upper surface electrode formed over at least the upper surface structure. Here, the semiconductor layer corresponds to the drift layer 2, for example. The upper surface structure includes, for example, a base region 3, a source region 4, a gate insulating film 5, a gate electrode 6, and an interlayer insulating film 20. The upper surface electrode includes a first electrode formed on at least the upper surface of the drift layer 2, and a second electrode formed over the upper surface of the first electrode. Here, the first electrode corresponds to the source electrode 7, for example. Here, the second electrode corresponds to the source electrode 10, for example. Further, at least one concave portion is formed on the upper surface of the source electrode 7. Here, the concave portion corresponds to the tapered concave portion 8, for example. The side surface of the tapered concave portion 8 has a tapered shape. The source electrode 10 is formed over the upper surface of the source electrode 7 including the inside of the tapered concave portion 8.

According to such a configuration, with a configuration in which the source electrode 10 is formed also in the tapered concave portion 8 formed on the upper surface of the source electrode 7, even when the stress is applied by energization, switching operation or the like, the contact area between the source electrode 7 and the source electrode 10 can be increased and in addition, the stress applied to the contact portion can be reduced. Therefore, the connection between the source electrode 7 and the source electrode 10 can be maintained in an appropriate state; therefore, the reliability of the semiconductor device can be improved while suppressing the exfoliation of the electrode of the semiconductor device.

The description of the other configurations other than the configurations illustrated in the specification can be appropriately omitted. That is, as long as the described configurations are provided, the above-described effects can be produced.

However, even in the case where at least one of the other configurations other than the configurations illustrated in the specification is appropriately added to the configuration described above, that is, other configurations other than the configurations illustrated in the specification, which are not referred to as configurations described above are appropriately added, the similar effects can be produced.

Further, according to Embodiments described above, the angle between the side surface of the tapered concave portion 8 and the upper surface of the drift layer 2 is 5° or more. According to such a configuration, the stress applied to a contact portion between the source electrode 7 and the source electrode 10 can be reduced. Therefore, the connection between the source electrode 7 and the source electrode 10 can be maintained in an appropriate state.

Further, according to Embodiments described above, the angle between the side surface of the tapered concave portion 8 and the upper surface of the drift layer 2 is 60° or less. According to such a configuration, the stress applied to the contact portion between the source electrode 7 and the source electrode 10 can be reduced. Therefore, the connection between the source electrode 7 and the source electrode 10 can be maintained in an appropriate state.

Further, according to Embodiments described above, 100 or more tapered concave portions 8 are formed on the upper surface of the source electrode 7. According to such a configuration, the stress applied to the contact portion between the source electrode 7 and the source electrode 10 can be reduced. Therefore, the connection between the source electrode 7 and the source electrode 10 can be maintained in an appropriate state.

Further, according to Embodiments described above, the minute concave portions 15 formed on the upper surface of the source electrode 7A including the inside of the tapered concave portion 8 and having a width smaller than that of the tapered concave portion 8 are provided. According to such a configuration, by providing the concave portions having different widths, the contact area between the source electrode 7 and the source electrode 10 can be increased, and the stress applied to the contact portion can be reduced. Therefore, the connection between the source electrode 7 and the source electrode 10 can be maintained in an appropriate state.

Further, according to Embodiments described above, the width of the tapered concave portion 8 is 0.1 μm or more, and the width of the minute concave portion 15 is less than 0.1 μm. According to such a configuration, by providing the concave portions having different widths, the contact area between the source electrode 7 and the source electrode 10 can be increased, and the stress applied to the contact portion can be reduced. Therefore, the connection between the source electrode 7 and the source electrode 10 can be maintained in an appropriate state.

Further, according to Embodiments described above, the n-type drift layer 2, the upper surface structure formed on at least a surface layer of the drift layer 2, and the upper surface electrode formed over at least the upper surface structure are provided. The upper surface electrode includes a first electrode formed on at least the upper surface of the drift layer 2, and the source electrode 10 formed over the upper surface of the first electrode. Here, the first electrode corresponds to the source electrode 7B, for example. Further, at least one concave portion is formed on the upper surface of the source electrode 7B. Here, the concave portion corresponds to the minute concave portion 15, for example. Further, the width of the minute concave portion 15 is less than 0.1 μm. And the source electrode 10 is formed over the upper surface of the source electrode 7B including the inside of the minute concave portion 15. According to such a configuration, the contact area between the source electrode 7B and the source electrode 10 can be increased, and the stress applied to the contact portion can be reduced. Therefore, the connection between the source electrode 7B and the source electrode 10 can be maintained in an appropriate state.

Note that, the description of the other configurations other than the configurations illustrated in the specification can be appropriately omitted. That is, as long as the described configurations are provided, the above-described effects can be produced.

However, even in the case where at least one of the other configurations other than the configurations illustrated in the specification is appropriately added to the configuration described above, that is, other configurations other than the configurations illustrated in the specification, which are not referred to as configurations described above are appropriately added, the similar effects can be produced.

Further, according to Embodiments described above, one or more minute concave portions 15 are arranged per 1 μm$^2$. According to such a configuration, the contact area between the source electrode 7B and the source electrode 10 can be increased, and the stress applied to the contact portion can be reduced. Therefore, the connection between the source electrode 7B and the source electrode 10 can be maintained in an appropriate state.

Further, according to Embodiments described above, the upper surface structure includes a p-type base region 3 selectively formed on the surface layer of the drift layer 2, an n-type source region 4 selectively formed on the surface layer of the base region 3, a gate electrode 6 formed in contacting with the upper surface of the base region 3 interposed between the source region 4 and the drift layer 2 via a gate insulating film 5, and an interlayer insulating film 20 formed over the gate electrode 6. Therefore, the connection between the source electrode 7 or the source electrode 7B and the source electrode 10 can be maintained in an appropriate state; therefore, the reliability of the semiconductor device can be improved while suppressing the exfoliation of the electrode of the semiconductor device.

Further, according to Embodiments described above, the above-described semiconductor device is included, and, the conversion circuit 201 that convers input power and outputs the power, the drive circuit 202 that outputs a drive signal for driving the semiconductor device to the semiconductor device, and the control circuit 203 that outputs a control signal for controlling the drive circuit 202 to the drive circuit 202. According to such a configuration, with a configuration in which the source electrode 10 is formed also in the concave portion formed on the upper surface of the source electrode, even when the stress is applied by energization, switching operation or the like, the contact area between the source electrode and the source electrode 10 can be increased and in addition, the stress applied to the contact portion can be reduced. Therefore, the connection between the source electrode and the source electrode 10 can be maintained in an appropriate state; therefore, the reliability of the semiconductor device can be improved while suppressing the exfoliation of the electrode of the semiconductor device.

According to Embodiments described above, in the method of manufacturing the semiconductor device, the upper surface structure is formed on at least the surface layer of the n-type drift layer 2. Then, a first upper surface electrode covering at least the upper surface structure is formed. Here, the first upper surface electrode corresponds to the source electrode 7, the source electrode 7A, or the source electrode 7B, for example. Then, the activation treatment is performed on the upper surface of the source electrode 7. Then, after the activation treatment, first zincate treatment for forming a zinc film is performed on the upper surface of the source electrode 7. Then, after the first zincate treatment, a second upper surface electrode is formed by performing the plating treatment on the upper surface of the source electrode 7. Here, the second upper surface electrode corresponds to the source electrode 10, for example.

According to such a configuration, even when a stress is applied due to energization or switching operation, the connection state of the electrode layers can be appropriately maintained because the upper surface of the source electrode 7 is cleaned, and further, the adhesion of the plating film is improved by forming the source electrode 10 by the plating treatment after performing the activation treatment on the upper surface of the source electrode 7 and the zincate treatment on the upper surface of the source electrode 7 as plating pretreatment.

Note that, the description of the other configurations other than the configurations illustrated in the specification can be appropriately omitted. That is, as long as the described configurations are provided, the above-described effects can be produced.

However, even in the case where at least one of the other configurations other than the configurations illustrated in the specification is appropriately added to the configuration described above, that is, other configurations other than the configurations illustrated in the specification, which are not referred to as configurations described above are appropriately added, the similar effects can be produced.

Further, the order of implementation of the respective processes can be changed, unless otherwise specified.

Further, according to Embodiments described above, after the first zincate treatment and before the plating treatment, the zincate exfoliation for removing the zinc film is performed, and further, the second zincate treatment for forming the zinc film is performed. According to such a configuration, a thin and uniform aluminum oxide film can be formed by the zincate exfoliation; therefore, the uniformity of the plating film formed by the plating treatment is also improved. Therefore, the connection state of the electrode layers can be improved.

Further, according to Embodiments described above, at the time of the zincate exfoliation, a first concave portion is formed on the upper surface of the source electrode 7A. Here, the concave portion corresponds to the minute concave portion 15, for example. According to such a configuration, the contact area between the source electrode 7A and the source electrode 10 can be increased, and the stress applied to the contact portion can be reduced. Therefore, the connection between the source electrode 7A and the source electrode 10 can be maintained in an appropriate state.

Further, according to Embodiments described above, a second concave portion is formed on the upper surface of the source electrode 7 by the heat treatment after the source electrode 7 is formed. Here, the second concave portion corresponds to the tapered concave portion 8, for example. According to such a configuration, the contact area between the source electrode 7 and the source electrode 10 can be increased, and the stress applied to the contact portion can be reduced. Therefore, the connection between the source electrode 7 and the source electrode 10 can be maintained in an appropriate state.

Further, According to Embodiments described above, the side surface of the tapered concave portion 8 has a tapered shape. According to such a configuration, the contact area between the source electrode 7 and the source electrode 10 can be increased, and the stress applied to the contact portion can be reduced. Therefore, the connection between the source electrode 7 and the source electrode 10 can be maintained in an appropriate state.

Further, according to Embodiments described above, the heat treatment for forming the tapered concave portions 8 is performed at 350° C. or more and 500° C. or less. According to such a configuration, depending on the temperature of the heat treatment after the formation of the source electrode 7, the angle $\theta$ can be increased or decreased.

Further, according to Embodiments described above, the above-described semiconductor device is included and the conversion circuit 201 that convers input power and outputs the power is provided. And the drive circuit 202 that outputs a drive signal for driving the semiconductor device to the semiconductor device. Then the control circuit 203 that outputs a control signal for controlling the drive circuit 202 to the drive circuit 202 is provided. According to such a configuration, even when a stress is applied due to energization or switching operation, the connection state of the electrode layers can be appropriately maintained because the upper surface of the source electrode 7 is cleaned, and further, the adhesion of the plating film is improved by forming the source electrode 10 by the plating treatment after performing the activation treatment on the upper surface of the source electrode 7 and the zincate treatment on the upper surface of the source electrode 7 as plating pretreatment.

<Configuration of Semiconductor Device>

Figure 28:
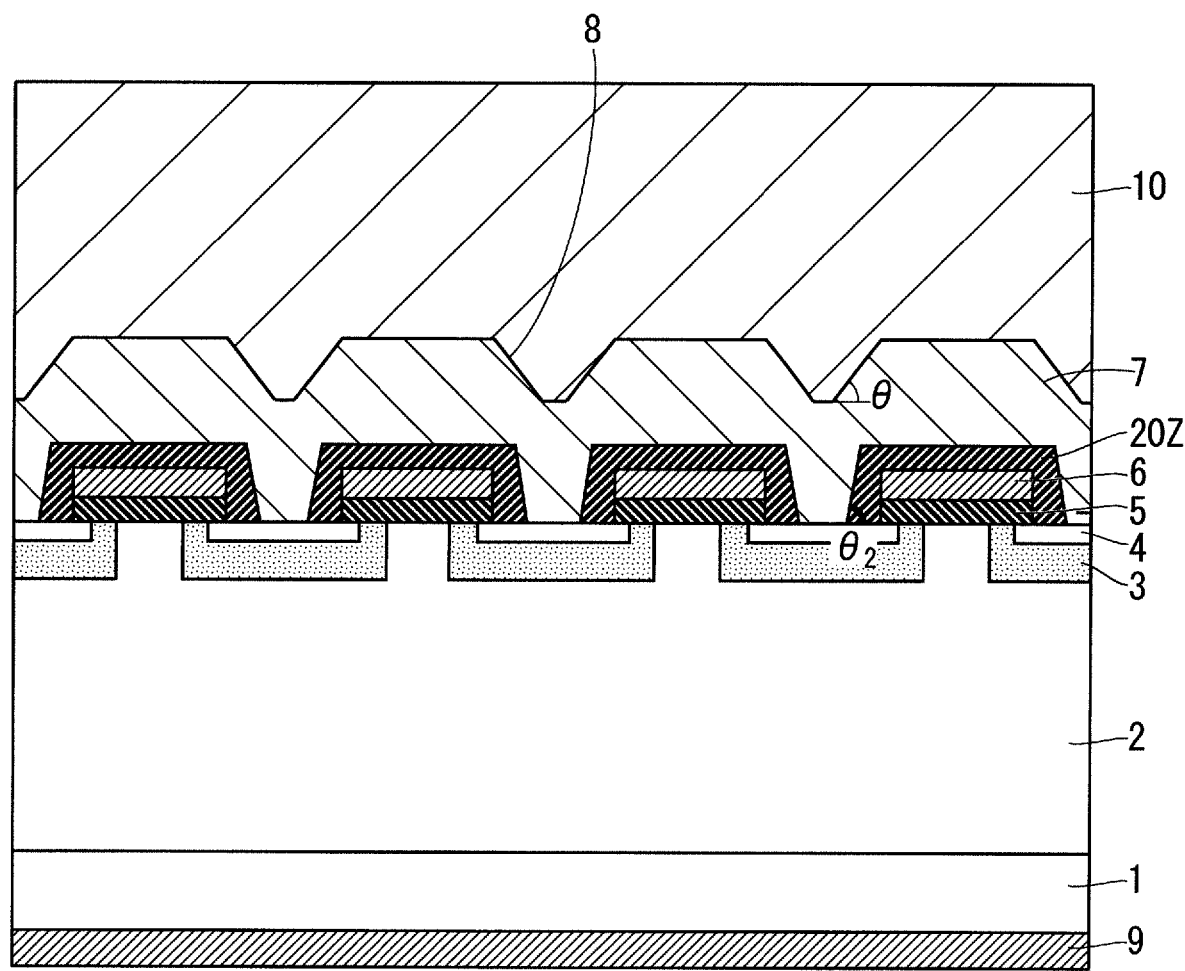
FIG. 28 A cross-sectional view related to the definition of an angle θ in the configuration of the semiconductor device.

FIG. 28 is a cross-sectional view schematically illustrating an example of a configuration of a semiconductor device according to Embodiment 4.

FIG. 28 illustrates a case where SiC is used for a semiconductor substrate. The configuration illustrated in FIG. 28 is a SiC-MOSFET having a planar gate structure, and a cell structure of a main part thereof. As the overall configuration of the semiconductor device, the configuration illustrated in FIG. 28 is extended in the left-right direction of FIG. 28.

As illustrated in FIG. 28, the semiconductor device includes an n-type SiC substrate 1, an n-type drift layer 2, a p-type base region 3, an n-type source region 4, a gate electrode 6 formed via a gate insulating film 5, an interlayer insulating film 20Z, a source electrode 7, a source electrode 10, and a drain electrode 9.

Here, the side surface of the interlayer insulating film 20Z has a tapered shape. Note that the angle between the tapered side surface of the interlayer insulating film 20Z and the upper surface of the SiC substrate 1 is defined as an angle $\theta 2$. The source electrode 7 is formed over the interlayer insulating film 20Z including the side surface of the interlayer insulating film 20Z. The angle $\theta$ between the side surface of the tapered concave portion 8 and the upper surface of the SiC substrate 1 is smaller than the angle $\theta 2$ between the side surface of the interlayer insulating film 20Z and the upper surface of the SiC substrate 1.

Figure 34:
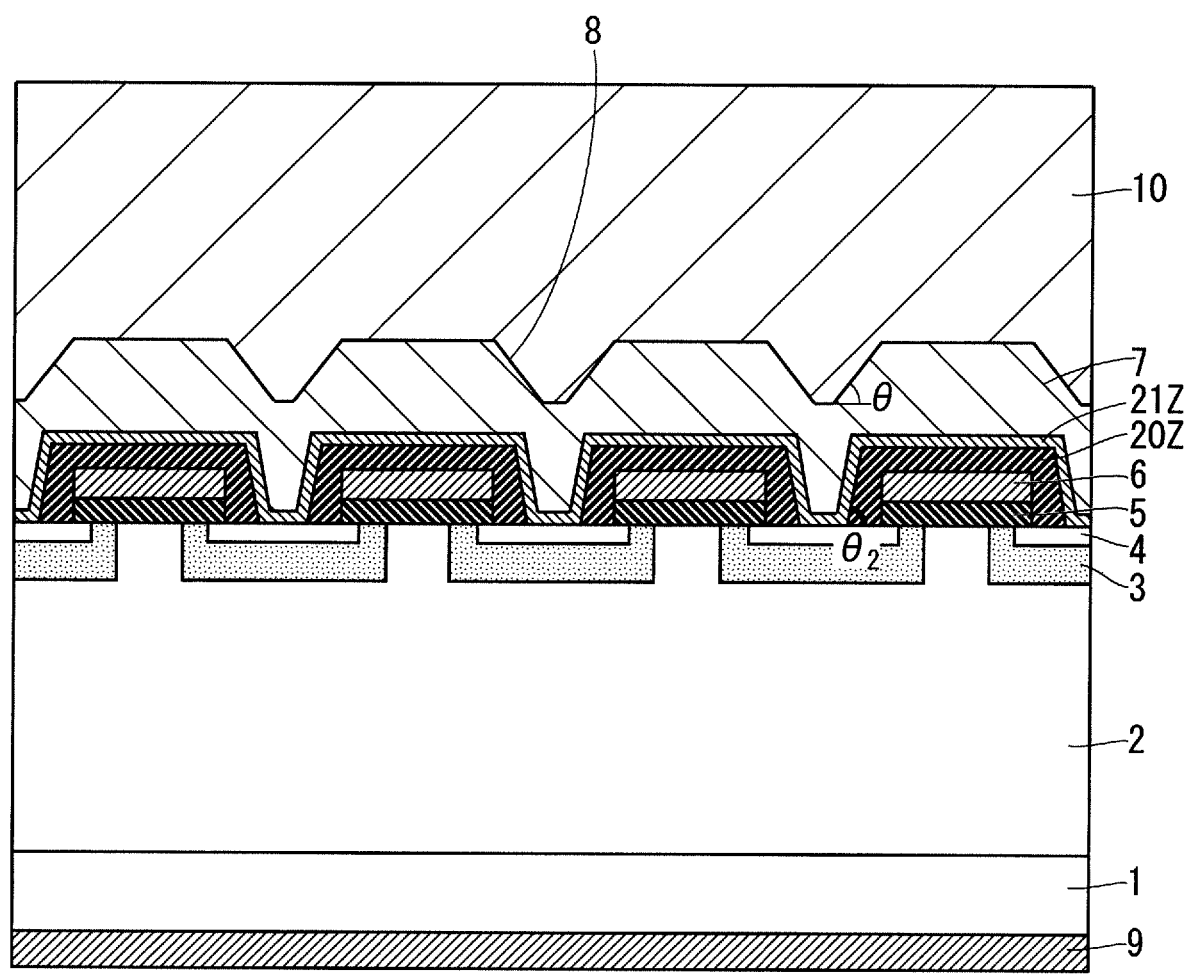
FIG. 34 A cross-sectional view schematically illustrating an example of the configuration of the semiconductor device illustrated in FIG. 28 further including a barrier metal.

Further, FIG. 34 is a cross-sectional view schematically illustrating an example of a configuration of the semiconductor device illustrated in FIG. 28 further including barrier metal.

As illustrated in the example in FIG. 34, the semiconductor device includes an n-type SiC substrate 1, a drift layer 2, a base region 3, a source region 4, a gate electrode 6 formed via a gate insulating film 5, an interlayer insulating film 20Z, a barrier metal 21Z formed over the upper surface of the interlayer insulating film 20Z and the upper surface of the exposed source region 4, a source electrode 7 formed over the upper surface and the side surfaces of the barrier metal 21Z, a source electrode 10, and a drain electrode 9.

<Manufacturing Method of Semiconductor Device>

The manufacturing process of the semiconductor device according to Embodiment 4 is almost the same as the manufacturing process illustrated in FIG. 5. That is, as illustrated in FIG. 7, the remaining portion of the gate insulating film 5 on the upper surface of the source region 4 is removed by a photolithography technique and an etching technique. Then, the interlayer insulating film 20Z is formed, and further, the interlayer insulating film 20Z is patterned (Step ST02).

However, in a manner illustrated in FIG. 28, as the interlayer insulating film 20Z, a boron phosphor silicate glass (BPSG) film made of glass containing boron or phosphorus is deposited, in which about 1.5 to 3.5 wt % of boron and about 6.0 to 9.0 mol % of phosphorus are contained.

Further, in the manner illustrated in FIG. 28, after the interlayer insulating film 20Z is patterned, the heat treatment is performed at 800° C. or higher and at 1050° C. or lower for about 2 hours, and the angle of the side surface of the interlayer insulating film 20Z is $\theta 2$.

More preferably, about 2.0 to 3.0 wt % of boron and about 6.5 to 8.5 mol % of phosphorus are contained, and the heat treatment at 850° C. or higher and 1000° C. or lower for 30 minutes or longer and 60 minutes or shorter is performed.

Here, in the process of manufacturing the semiconductor device, when heat treatment is performed at the time of forming the interlayer insulating film 20Z, for example, the corners on the upper surface of the interlayer insulating film 20Z, and the bottom portions on the side surfaces of the interlayer insulating film 20Z are scraped and removed. In such a case, the angle $\theta 2$ is difficult to define as illustrated in the example in FIG. 28.

Therefore, in such a case, the midpoint between the uppermost portion on the upper surface of the interlayer insulating film 20Z and the bottom on the side surface of the interlayer insulating film 20Z is determined, and further, a tangent line to the side surface of the interlayer insulating film 20Z located at the same height as the midpoint is drawn. The angle between the tangent line and the upper surface of SiC substrate 1 is defined as angle θ2.

Figure 29:
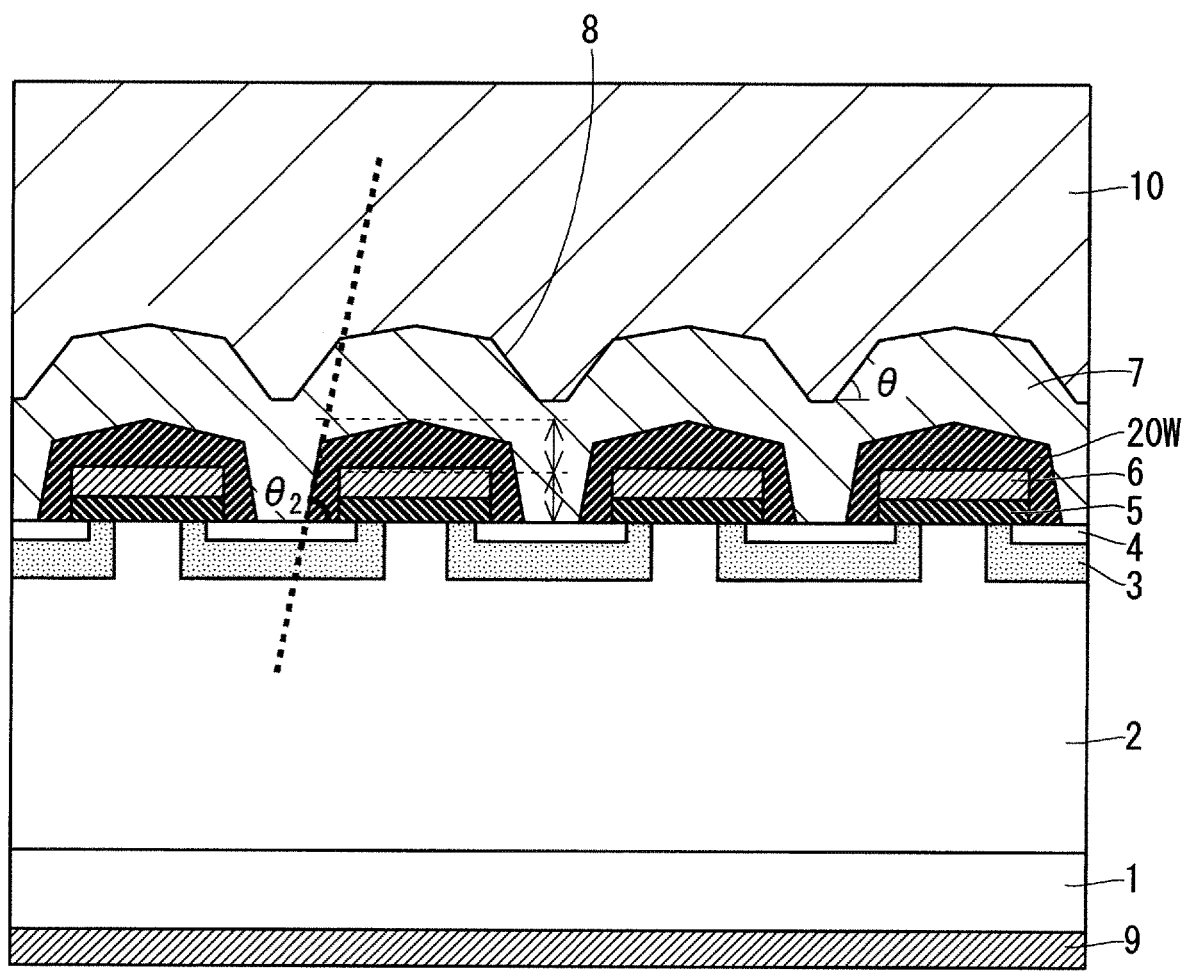
FIG. 29 A cross-sectional view related to the definition of an angle θ in the configuration of the semiconductor device.

FIG. 29 is a cross-sectional view related to the definition of the angle θ2 in the configuration of the semiconductor device.

In the case of the interlayer insulating film 20W having a shape as illustrated in FIG. 29, the midpoint between the uppermost portion on the upper surface of the interlayer insulating film 20W and the bottom on the side surface of the interlayer insulating film 20W is determined, and further, a tangent line to the side surface of the interlayer insulating film 20W located at the same height as the midpoint is drawn. Then the angle between the tangent line and the upper surface of SiC substrate 1 is defined as angle θ2.

Note that the angle θ2 can be similarly defined even when minute concave portions are formed as illustrated in FIG. 4.

In the manners illustrating in FIGS. 28 and 29, the contact area between source electrode 7 and the interlayer insulating film can be increased by making the side surface of the interlayer insulating film tapered. Therefore, the stress applied between the source electrode 7 and the interlayer insulating film can be reduced while reducing the change in the on-resistance of the semiconductor device.

More preferably, as illustrated in FIG. 29, it is desirable that the angle θ2 of the side surface of the interlayer insulating film 20W becomes larger as the angle θ2 approaches the bottom of the side surface of the interlayer insulating film 20W. According to the configuration, cracks are suppressed from generated on the upper surface of interlayer insulating film 20W, and insulation failure between the source electrode 7 and gate electrode 6 can be reduced.

<Modification of Embodiments Described Above>

In Embodiments described above, materials, material properties, dimensions, shapes, relative arrangement relations, conditions for implementation, and so forth for the respective components may be described, however, these represent a mare example in all aspects, and are not limited to the description in the specification.

Accordingly, it is understood that numerous other modifications, variations, and equivalents can be devised without departing from the scope of the invention. For example, the following cases where at least one of the components is to be modified, added, or omitted, further, at least one of the components of at least one of Embodiments is extracted and then combined with components of other Embodiment, are involved.

So far as consistent with Embodiments, "one or more" of the components described as being provided "one" in Embodiments described above may be provided.

Furthermore, each component in Embodiments described above is a conceptual unit, and a case where one component is composed of multiple structures, a case where one component corresponds to a portion of a structure, and further, a plurality of components are provided with one structure are included within the scope of the technology disclosed in the specification.

Each component in Embodiments described above includes a structure having another structure or shape as long as the same function is exhibited.

Also, the descriptions in the specification are referred for the every object related to the technique, and the descriptions each are not regarded as conventional techniques.

In addition, in Embodiments described above, when a material name or the like is described without being specified in particular, so far as consistent with Embodiments, the material includes other additives, such as an alloy.

Further, in Embodiments described above, the semiconductor substrate is of the n-type, but may be of the p-type. That is, in Embodiments described above, although the MOSFET has been described as an example of the silicon carbide semiconductor device, an IGBT, an SBD, or an pn diode are assumed to be applied as an example of the silicon carbide semiconductor device.

When the example of the silicon carbide semiconductor device is an IGBT, the source electrode corresponds to an emitter electrode, and the drain electrode corresponds to a collector electrode. Further, although a layer of the opposite conductivity type to the drift layer is located on the lower surface of the drift layer when the example of the silicon carbide semiconductor device is an IGBT, a layer located on the lower surface of the drift layer may be a layer newly formed on the lower surface of the drift layer, or a semiconductor substrate on which the drift layer is formed as in the case of Embodiments described above.

Further, in Embodiments described above, although it has been described that the first conductivity type is the n-type, and the second conductivity type is the p-type, the first conductivity type may be the p-type and the second conductivity type may be n-type in an inverted manner.

In Embodiments described above, although a so-called vertical MOSFET has been described, it is also assumed to be applied to a horizontal MOSFET.

Also in Embodiments described above, although a planar type MOSFET has been described, it is also assumed to be applied to a trench type MOSFET in which a trench is formed on the upper surface of the drift layer. When it is applied to a trench type MOSFET, a trench, that is a groove portion, is formed on the upper surface of the drift layer, and a gate electrode is embedded in the groove portion. The gate electrode is embedded between the bottom surface and the side surface of the trench via the gate insulating film.

EXPLANATION OF REFERENCE SIGNS

1 SiC substrate, 2,2Y drift layer, 3,3Y base region, 4,4Y source region, 5,5Y gate insulating film, 6,6Y gate electrode, 7,7A,7B,7C,7D,7E,7F,7G,7X,7Y,10,10X,10Y source electrode, 8,8Y tapered concave portion, 9 drain electrode, 11 semiconductor device, 12, solder, 13 lead frame, 14 mold resin, 15 minute concave portion, 16 intermetallic compound, 17 bonding electrode, 20,20W,20Y,20Z interlayer insulating film, 100 power supply, 200 power conversion device, 201 conversion circuit, 202 drive circuit, 203 control circuit, 300 load, 400 trench.

The invention claimed is:
1. A semiconductor device comprising:
a semiconductor layer of first conductivity type;
an upper surface structure formed at least on a surface layer of the semiconductor layer; and
an upper surface electrode formed over at least the upper surface structure, wherein
the upper surface electrode includes
a first electrode formed on at least an upper surface of the semiconductor layer, and
a second electrode formed over an upper surface of the first electrode,
at least one first concave portion is formed on the upper surface of the first electrode, a side surface of the first concave portion has a tapered shape, the second electrode is formed over the upper surface of the first electrode including an inside of the first concave portion, the semiconductor device further comprises a second concave portion penetrating the upper surface of the first electrode including an inside of the first concave portion, and having a width smaller than that of the first concave portion and a depth less than a thickness of the first electrode, and the second concave portion is formed on a slope in the first concave portion.

2. A semiconductor device comprising:

a semiconductor layer of first conductivity type;

an upper surface structure formed at least on a surface layer of the semiconductor layer; and an upper surface electrode formed over at least the upper surface structure, wherein the upper surface electrode includes
 a first electrode formed on at least an upper surface of the semiconductor layer, and
 a second electrode formed over an upper surface of the first electrode, at least one first concave portion is formed on the upper surface of the first electrode, a side surface of the first concave portion has a tapered shape, the second electrode is formed over the upper surface of the first electrode including an inside of the first concave portion, and the semiconductor device further comprises a second concave portion penetrating the upper surface of the first electrode in a portion where the first concave portion is not formed, and having a width smaller than that of the first concave portion and a depth less than a thickness of the first electrode.

3. The semiconductor device according to claim 1, wherein
an angle between a side surface of the first concave portion and the upper surface of the semiconductor layer is 5° or more.

4. The semiconductor device according to claim 1, wherein
the angle between a side surface of the first concave portion and the upper surface of the semiconductor layer is 60° or less.

5. The semiconductor device according to claim 1, wherein
a number of the first concave portions formed on the upper surface of the first electrodes is 100 or more.

6. The semiconductor device according to claim 1, wherein
a number of the second concave portions arranged per 1 $\mu m^2$ is one or more.

7. The semiconductor device according to claim 1, wherein
the first concave portion has a width of 0.1 μm or more and the second concave portion has a width of less than 0.1 μm.

8. The semiconductor device according to claim 1, wherein
the upper surface structure includes
 a base region of second conductivity type selectively formed on the surface layer of the semiconductor layer,
 a source region of first conductive type selectively formed on a surface layer of the base region,
 a gate electrode formed in contacting with the base region interposed between the source region and the first semiconductor layer via a gate insulating film,
 an interlayer insulating film formed over the gate electrode.

9. The semiconductor device according to claim 8, wherein
an angle between a side surface of the interlayer insulating film and the upper surface of the semiconductor layer is larger than the angle between a side surface of the first concave portion and the upper surface of the semiconductor layer.

10. A power conversion device comprising:

a conversion circuit including the semiconductor device according to claim 1, and configured to convert input power and output the power;

a drive circuit configured to output a drive signal for driving the semiconductor device to the semiconductor device; and a control circuit configured to output a control signal for controlling the drive circuit to the drive circuit.

11. The semiconductor device according to claim 2, wherein
an angle between a side surface of the first concave portion and the upper surface of the semiconductor layer is 5° or more.

12. The semiconductor device according to claim 2, wherein
the angle between a side surface of the first concave portion and the upper surface of the semiconductor layer is 60° or less.

13. The semiconductor device according to claim 2, wherein
a number of the first concave portions formed on the upper surface of the first electrodes is 100 or more.

14. The semiconductor device according to claim 2, wherein
a number of the second concave portions arranged per 1 $\mu m^2$ is one or more.

15. The semiconductor device according to claim 2, wherein
the first concave portion has a width of 0.1 μm or more and the second concave portion has a width of less than 0.1 μm.

16. The semiconductor device according to claim 2, wherein
the upper surface structure includes
 a base region of second conductivity type selectively formed on the surface layer of the semiconductor layer,
 a source region of first conductive type selectively formed on a surface layer of the base region,
 a gate electrode formed in contacting with the base region interposed between the source region and the first semiconductor layer via a gate insulating film, and
 an interlayer insulating film formed over the gate electrode.

17. The semiconductor device according to claim 16, wherein
an angle between a side surface of the interlayer insulating film and the upper surface of the semiconductor layer is larger than the angle between a side surface of the first concave portion and the upper surface of the semiconductor layer.

18. A power conversion device comprising:
a conversion circuit including the semiconductor device according to claim 2, and configured to convert input power and output the power;
a drive circuit configured to output a drive signal for driving the semiconductor device to the semiconductor device; and
a control circuit configured to output a control signal for controlling the drive circuit to the drive circuit.

* * * * *